US006479166B1

(12) United States Patent
Heuer et al.

(10) Patent No.: US 6,479,166 B1
(45) Date of Patent: *Nov. 12, 2002

(54) LARGE AREA POLYSILICON FILMS WITH PREDETERMINED STRESS CHARACTERISTICS AND METHOD FOR PRODUCING SAME

(75) Inventors: Arthur H. Heuer, Cleveland, OH (US); Harold Kahn, Lakewood, OH (US); Jie Yang, Woodbury, CT (US); Stephen M. Phillips, Chesterland, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/561,675

(22) Filed: May 1, 2000

Related U.S. Application Data

(63) Continuation-in-part of application No. 09/449,790, filed on Nov. 26, 1999, which is a continuation-in-part of application No. 09/260,168, filed on Mar. 1, 1999.
(60) Provisional application No. 60/103,163, filed on Oct. 6, 1998.

(51) Int. Cl.⁷ .............................................. H01L 29/12
(52) U.S. Cl. ........................ 428/620; 428/636; 428/446
(58) Field of Search ........................................ 428/446

(56) References Cited

U.S. PATENT DOCUMENTS

| | | |
|---|---|---|
| 3,856,647 A | 12/1974 | Blachman |
| 3,900,597 A | 8/1975 | Chruma et al. |
| 4,240,196 A | 12/1980 | Jacobs et al. |
| 4,251,571 A | 2/1981 | Garbarino et al. |
| 4,270,960 A | 6/1981 | Bollen et al. |
| 4,631,804 A | 12/1986 | Roy |
| 4,742,020 A | 5/1988 | Roy |
| 4,897,360 A | 1/1990 | Guckel et al. |
| 5,059,556 A | 10/1991 | Wilcoxen |
| 5,110,757 A | 5/1992 | Arst et al. |

(List continued on next page.)

FOREIGN PATENT DOCUMENTS

EP 798770 A2 10/1997

OTHER PUBLICATIONS

Kahn et al., "Mechanical Properties of Thick, Surface Micromachined Polysilicon Films," Proc. IEEE Micro Electro Mech. Syst. Workshop, MEMS 96, pp 343–348, 1996 (no month).

Kakinuma, "Comprehensive Interpretation of the Preferred Orientation of Vapor–Phase Grown Polycrystalline Silicon Films," J. Vac. Sci. Technol. A, vol. 13, No. 5, pp. 2310–2317, 1995 (no month).

(List continued on next page.)

Primary Examiner—Deborah Jones
Assistant Examiner—Arden B Sperty
(74) Attorney, Agent, or Firm—Fay, Sharpe, Fagan, Minnich & McKee, LLP

(57) ABSTRACT

Multi-layer assemblies of polysilicon thin films having predetermined stress characteristics and techniques for forming such assemblies are disclosed. In particular, a multi-layer assembly of polysilicon thin films may be produced that has a stress level of zero, or substantially so. The multi-layer assemblies comprise at least one constituent thin film having a tensile stress and at least one constituent thin film having a compressive stress. The thin films forming the multi-layer assemblies may be disposed immediately adjacent to one another without the use of intermediate layers between the thin films. Multi-layer assemblies exhibiting selectively determinable overall bending moments are also disclosed. Selective production of overall bending moments in microstructures enables manufacture of such structures with a wide array of geometrical configurations.

12 Claims, 16 Drawing Sheets

U.S. PATENT DOCUMENTS

| | | | |
|---|---|---|---|
| 5,225,951 | A | 7/1993 | Kira et al. |
| 5,233,459 | A | 8/1993 | Bozler et al. |
| 5,287,081 | A | 2/1994 | Kinard et al. |
| 5,298,436 | A | 3/1994 | Radosevich et al. |
| 5,303,595 | A | 4/1994 | Shoji et al. |
| 5,319,479 | A | 6/1994 | Yamada et al. |
| 5,332,689 | A | 7/1994 | Sandhu et al. |
| 5,393,351 | A | 2/1995 | Kinard et al. |
| 5,633,552 | A | 5/1997 | Lee et al. |
| 5,753,134 | A | 5/1998 | Biebl |
| 5,863,659 | A | 1/1999 | Kobayshi et al. |
| 6,268,068 | B1 * | 7/2001 | Heuer et al. ............... 428/446 |

OTHER PUBLICATIONS

Guckel et al. "Fine–Grained Polysilicon Films with Built–In Tensile Strain," *IEEE Transactions on Electron Devices*, vol. 35, No. 6, 1988, pp 800–803 (no month).

P. Joubert et al., "The Effect of Low Pressure on the Structure of LPCVD Polycrystalline Silicon Films," *J. Electrochem. Soc.*, vol. 134 No. 10, pp 2541–2544, 1987 (no month).

Huang et al., "Investigation of texture and stress in undoped polysilicon films," MRS Symposium Proceedings, vol. 182, pp. 201–206, 1990 (no month).

Yu et al., "Stress and microstructural evolution of LPCVD polysilicon thin films during high temperature annealing," MRS Symposium Proceedings, vol. 441, pp. 403–408, 1997 (no month).

Guckel et al., "The application of fine–grained, tensile polysilicon to mechanically resonant transducers," *Sensors and Actuators*, vol. A21–A23, pp 346–351, 1990 (abstract).

Furtsch et al., "Comprehensive study of processing parameters influencing the stress and stress gradient of thick polysilicon layers," *SPIE Proceedings*, vol. 3223, pp 130–141, 1997 (no month).

Kirsten et al., "Deposition of thick doped polysilicon films with low stress in an epitaxial reactor for surface micromachining applications" *Thin Solid Films* 259 pp 181–187 (1995) (no month).

Lange et al., "Thick polycrystalline silicon for surface–micromechanical applications: deposition, structuring and mechanical characterization," *Sensors and Actuators*, A 54 pp 674–678 (1996) (no month).

Furtsch et al., "Texture and stress profile in thick polysilicon films suitable for fabrication of microstructures," *Thin Solid Films* 296 pp 177–180 (1997) (no month).

* cited by examiner

LARGE AREA POLYSILICON FILMS WITH PREDETERMINED STRESS CHARACTERISTICS AND METHOD FOR PRODUCING SAME

CROSS REFERENCES TO RELATED APPLICATIONS

This application is a continuation-in-part application from U.S. application Ser. No. 09/449,790 filed Nov. 26, 1999 which is a continuation-in-part application from U.S. application Ser. No. 09/260,168 filed Mar. 1, 1999, which claims priority from U.S. Provisional Application Serial No. 60/103,163, filed Oct. 6, 1998.

This invention was made with government support under Grant No. NASA 342-9405 awarded by NASA. The government has certain rights in this invention.

FIELD OF THE INVENTION

The present invention relates to multi-layer assemblies of thin films, such as for example, those formed from polysilicon. The thin films have predetermined stress characteristics. The present invention also relates to forming such thin films with desired stress profiles by controlling film formation conditions. By appropriately depositing variously stressed thin films and forming multi-layer assemblies therefrom, a resulting multi-layer assembly may be produced that exhibits a predetermined stress profile. The predetermined distribution of stresses in the multi-layer assembly may be sufficient, if desired, to induce geometrical effects such as curling or arching of the assembly. A wide array of devices and applications are also disclosed that may utilize, or at least be based upon, the present invention.

BACKGROUND OF THE INVENTION

Polysilicon is one of the most widely used structural materials for microelectromechanical systems (MEMS) and devices. However, when deposited by low-pressure chemical vapor deposition (LPCVD) techniques, polysilicon films typically display high residual stresses and often stress gradients as well. These stresses, particularly when compressive, may cause released devices to bend and buckle, altering their original shapes and degrading their performances. While tensile stresses may promote planarity in doubly clamped designs, such stresses also increase stiffness and cause deformation of asymmetric features. Zero-stress polysilicon thin film structures would be optimal for many applications.

Prior artisans have attempted to produce thin silicon films with reduced stress levels. U.S. Pat. No. 5,753,134 entitled "Method for Producing a Layer With Reduced Mechanical Stresses" to Biebl, is directed to a method for producing a silicon layer having a reduced overall stress value, the layer being composed of two silicon sublayers. The first sublayer and the second sublayer are matched to one another such that the stresses in the two layers substantially compensate each other, and in effect, cancel each other out. However, Biebl requires that one or more auxiliary layers of silicon dioxide be provided between the sublayers. Those auxiliary layers require additional manufacturing or processing operations. Although satisfactory in some respects, a need still exists for an improved multi-layer polysilicon assembly and technique for forming, and particularly for an assembly that does not require the use of intermediate or auxiliary layers.

In addition, a disadvantage often associated with polysilicon films deposited by chemical vapor deposition techniques, pertains to the resulting relatively rough surface of the deposited film. Although approaches are known for producing films having relatively smooth finishes, typically, additional processing steps are necessary or critical process control schemes must be implemented. Accordingly, a need remains for a technique for producing films and multi-layer assemblies of such films having relatively smooth surfaces.

Recent efforts in the field of MEMS have been directed to producing microdevices and microstructures that exhibit a particular geometrical configuration. Often, it is desirable to produce curved or cantilevered geometries. However, given the relative small scale of such geometries, conventional microdevice fabrication techniques have been found to not be suitable, and in many instances, exhibit significant limitations. Accordingly, it would be desirable to provide a technique whereby microdevices and particularly microstructures, could be produced and which would exhibit a specific geometrical arrangement.

SUMMARY OF THE INVENTION

The present invention achieves the foregoing objectives and provides in a first aspect, a method for selectively imparting a predetermined cumulative bending moment to a multi-layer assembly of polysilicon thin films. The method comprises providing a multi-layer assembly of polysilicon thin films which has an outermost exposed face. The method also involves then depositing a relatively thin polysilicon layer onto the outermost face under conditions such that the layer will exhibit known residual stresses. The thickness of the layer is controlled during deposition so that a desired cumulative bending moment for the resulting assembly is obtained.

In an additional aspect, the present invention provides a method for producing a multi-layer assembly of polysilicon thin films, such that the assembly has a predetermined overall bending moment. As explained in greater detail herein, the predetermined bending moment may be positive, negative, or zero. The method comprises forming a plurality of polysilicon thin film layers such that each layer exhibits a specific set of characteristics as follows. Each layer has either a devitrified microstructure and an internal tensile stress, or a predominantly columnar microstructure and an internal compressive stress. Each layer further exhibits a microstructure different than that of an adjacent thin film layer. Furthermore, each layer has a thickness and location in the multi-layer assembly such that the moments of each of the thin film layers sum to the predetermined desired overall bending moment.

The present invention further provides multi-layer assemblies formed by each of the foregoing noted methods.

In a further aspect, the present invention provides a multi-layer thin film assembly that includes a substrate upon which are disposed first and second thin films of polysilicon. One of the films has a devitrified microstructure and an internal tensile stress. The second thin film has a predominantly columnar microstructure and an internal compressive stress. The two films are immediately adjacent one another. The multi-layer assembly also includes a third thin film that is disposed on either the first or second thin films. The third film comprises polysilicon and has a thickness of between about 1 nm and about 1000 nm.

In yet an additional aspect according to the present invention, a method for forming a smooth surface from a polysilicon material is provided. In this aspect, the polysilicon smooth surface exhibits a RMS surface roughness value of less than 60 nm. The method comprises providing a substrate, and forming a polysilicon thin film having a devitrified microstructure and an internal tensile stress. The polysilicon thin film is deposited upon the substrate by chemical vapor deposition using silane at a temperature of from about 500° C. to about 590° C.

Moreover, in a further aspect, the present invention provides a technique for selectively modifying the stress characteristics in a collection of multi-layer polysilicon assemblies, particularly in a manufacturing environment. The method comprises preparing a collection of multi-layer assemblies and then identifying at least one representative sample from that collection. The one or more samples are then analyzed to determine their stress characteristics. Once having identified information of the stresses in the collection of assemblies, one or more relatively thin polysilicon layers are deposited on the assemblies to alter the overall stress characteristics of each of the assemblies.

Further scope of the applicability of the present invention will become apparent from the detailed description given hereinafter. It should, however, be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The following is a brief description of the drawings which are present for the purpose of illustrating the invention and not for purposes of limiting the invention.

DETAILED DESCRIPTION OF THE PREFERRED EMBODIMENTS

In one aspect, the present invention provides a multi-layer assembly of two or more layers of polysilicon thin films. At least one of the polysilicon thin films is devitrified and exhibits a residual tensile stress. In addition, at least one of the polysilicon thin films is predominantly columnar and exhibits a residual compressive stress. The layers of the multi-layer assembly are preferably arranged within the multi-layer assembly such that the stresses of the polysilicon thin films alternate with respect to each other across the thickness of the assembly. The term "devitrified" as used herein refers to a microstructure in which the material is deposited in a generally amorphous, vitreous, or non-crystalline state. After deposition, sites within the material begin to form organized, non-amorphous and generally crystalline regions. However, the deposition parameters and system variables associated with the present invention are such that the material devitrifies or alters its structure after deposition, either before completion of that layer or during subsequent processing. The term "predominantly columnar" refers to material that is deposited in a generally crystalline state, or readily transforms to a crystalline state immediately upon or after deposition.

Figure 1:
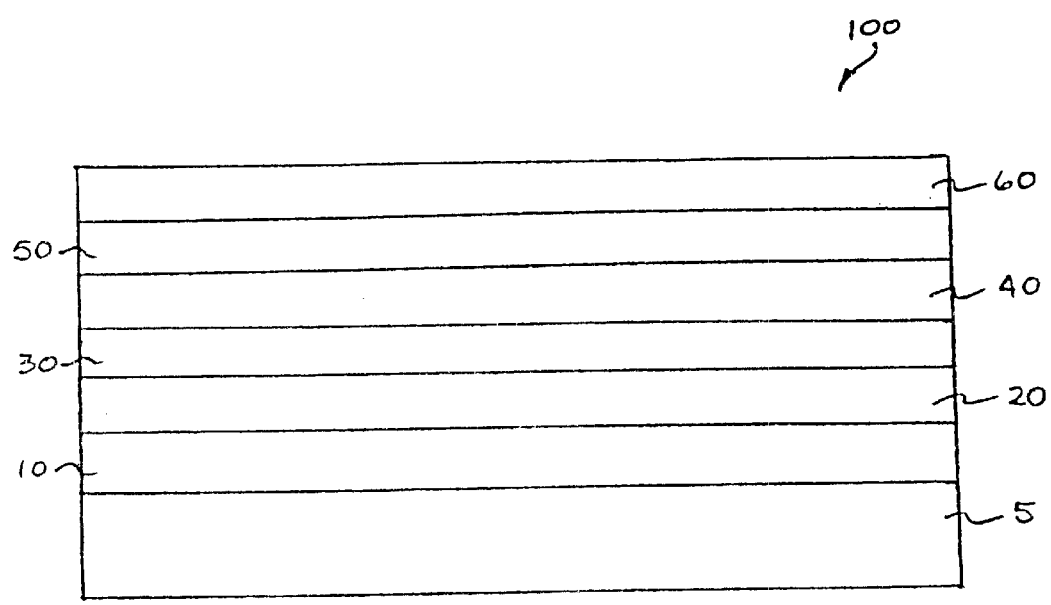
FIG. 1 is a schematic cross-sectional view of a preferred embodiment multi-layer polysilicon film in accordance with the present invention.

FIG. 1 is a schematic cross-sectional view of a preferred embodiment multi-layer polysilicon assembly 100 in accordance with the present invention. This multi-layer assembly according to the present invention is often referred to herein as the MultiPoly™ assembly. The process employed to produce such assembly, is generally referred to herein as the MultiPoly™ process. The multi-layer assembly 100 comprises a base or substrate 5, onto which are disposed a plurality of polysilicon thin films. A first polysilicon thin film 10 is deposited on the substrate 5 such that the thin film 10 is devitrified and has an inherent or residual tensile stress. A second polysilicon thin film 20 is deposited on the first devitrified thin film 10 such that the thin film 20 is predominantly columnar and has an inherent or residual compressive stress. A third polysilicon thin film 30 is deposited on the second polysilicon thin film 20 such that the thin film 30 is devitrified and has an inherent or residual tensile stress. A fourth polysilicon thin film 40 is deposited on the thin film 30 such that the thin film 40 is predominantly columnar and has an inherent or residual compressive stress. A fifth polysilicon thin film 50 is deposited on the fourth polysilicon thin film 40 such that the thin film 50 is devitrified and has an inherent or residual tensile stress. A sixth polysilicon thin film 60 is deposited on the thin film 50 such that the thin film 60 is predominantly columnar and has an inherent or residual compressive stress.

The arrangement of the thin films 10, 20, 30, 40, 50, and 60 may be reversed such that thin films 10, 30, and 50 have internal residual stresses that are compressive instead of tensile in nature. Similarly, in such an alternate arrangement, thin films 20, 40, and 60 have internal residual stresses that are tensile instead of compressive in nature.

The present invention provides a wide array of multi-layer thin film assemblies in addition to the six layer assembly depicted in FIG. 1. The present invention provides multi-layer assemblies having a number of thin films ranging from 2 up to 20 or more layers. The number of layers or thin films may be even or odd.

One of the significant advantages of the present invention is that the various layers, e.g., 10 and 20, do not require intermediate or auxiliary layers disposed between them. That is, a first polysilicon thin film having either a residual inherent tensile or compressive stress, may be disposed immediately adjacent to another polysilicon thin film, i.e., a second film, having a residual inherent stress, different than that of the first film. This enables stacked assemblies to be formed with fewer processing steps and also enables stacked assemblies of shorter profile or height than if intermediate layers are included between one or more thin films. Yet another advantage of the present invention relates to etching. Typically, etching is much easier if there are no intermediate layers of composition different than the previously described primary layers.

The thickness or height of the multi-layer assemblies of the present invention varies depending upon the end use application. However, typical thicknesses for the resulting assemblies range from about 1 micron to about 10 microns. Similarly, the thickness of individual layers constituting the multi-layer assembly may span a relatively wide range. However, preferred thicknesses for the individual layers range from about 1 nm to about 1000 nm. As will be appreciated, the thickness of the multi-layer assembly is the sum of the thicknesses of the individual thin films.

In another aspect of the present invention, a technique is provided whereby a multi-layer assembly is provided that has a predetermined overall level and type of stress. The overall level and type of stress of the multi-layer assembly may be selectively obtained by controlling the stress characteristics and thickness of each individual thin film within the assembly. That is, by adjusting the thin film processing conditions during formation of each thin film, and by controlling the thickness of each thin film, desired stresses can be imparted to each of the individual thin films that form the multi-layer stacked assembly. And, therefore, the overall level and type of stress of the multi-layer assembly may be selectively produced. This technique is described below and in the examples herein. As will be appreciated, the overall type of stress, i.e. compressive or tensile, and the value or degree of such stress of the resulting multi-layer assemblies, is generally the sum of the individual stresses of each of the constituent layers of films forming the multi-layer assembly.

Another important and significant feature of the present invention relates to a remarkable discovery that polysilicon stacked assemblies having relatively smooth exterior surfaces can be produced. In accordance with the present invention, a polysilicon thin film having an exterior face with a surface finish roughness less than about 25 nm is provided (all surface roughness values expressed herein are root mean square, RMS, values). Ideally, preferred surface roughness is zero or near zero. However, it will be appreciated that perfectly smooth surfaces are not obtainable. In accordance with the present invention, a multi-layer assembly is produced having an outer face roughness value of 16.3 nm. Generally, for columnar films, surface roughness increases as the layer thickness increases. Thus, in forming a smooth face layer, it is preferred for such a layer to be relatively thin.

And, as described herein, layers deposited to have amorphous or devitrified microstructures generally produce smoother faces than layers having crystalline or predominantly columnar microstructures. Accordingly, low deposition temperatures, i.e. about 570° C. to about 580° C., may be preferable when depositing initial (bottom) and last (top) layers. This aspect is described in greater detail herein.

Table 1, set forth below, summarizes stress characteristics of single and multi-layer polysilicon thin films in accordance with the present invention, before and after annealing. This table summarizes a feature of the present invention, that multi-layer polysilicon films, produced in accordance with the present invention, are surprisingly stable in that upon being subjected to relatively high temperatures, their stress characteristics do not significantly change.

TABLE 1

Stress Characteristics of Single and Multi-Layer Polysilicon Films. Before and After Annealing

| No. of layers | Deposition temperature(s) (° C.) | Annealing temperature (° C.) for 1 hour in Nitrogen | Stress (MPa) (Tensile is Positive) |
|---|---|---|---|
| 1 | 550 | as-deposited | −201 |
|   |     | 615 | −123 |
|   |     | 615 (1 additional hour) | 184 |
| 1 | 570 | as-deposited | 189 |
|   |     | 615 | 265 |
|   |     | 615 (1 additional hour) | 264 |
| 1 | 580 | as-deposited | 170 |
|   |     | 1000 | 27 |
| 1 | 615 | as-deposited | −200 |
|   |     | 800 | −140 |
|   |     | 1000 | −97 |
|   |     | 1100 | −28 |
| 6 | 580/610 | as-deposited | 25 |
|   |     | 800 | 28 |
|   |     | 1000 | −3 |
|   |     | 1100 | −19 |
| 8 | 580/615 | as-deposited | 3 |
|   |     | 800 | 15 |
|   |     | 1000 | 5 |
|   |     | 1100 | −10 |

TABLE 1-continued

Stress Characteristics of Single and Multi-Layer
Polysilicon Films. Before and After Annealing

| No. of layers | Deposition temperature(s) (° C.) | Annealing temperature (° C.) for 1 hour in Nitrogen | Stress (MPa) (Tensile is Positive) |
|---|---|---|---|
| 8 | 550/615 | as-deposited | −100 |
|   |   | 615 | 46 |
|   |   | 615 (1 additional hour) | 40 |
| 9 | 570/615 | as-deposited | 14 |
|   |   | 800 | 52 |
|   |   | 1000 | −11 |
|   |   | 1100 | −18 |
| 9 | 570/615 | as-deposited | −17 |
|   |   | 800 | 57 |
|   |   | 1000 | 0 |
|   |   | 1100 | −9 |
| 9 | 615/570 | as-deposited | −21 |
|   |   | 800 | 30 |
|   |   | 1000 | −15 |
|   |   | 1100 | −20 |

Table 2, set forth below, presents roughness measurements of a single layer of polysilicon deposited at 615° C., and a multi-layer polysilicon assembly comprising alternating layers of polysilicon, deposited at 580° C. and 615° C. All of these layers were deposited by LPCVD using silane. The surface roughness of the single layer was 70.7 nm, while the surface roughness of the outermost face of the exterior layer deposited at 615° C. was a surprisingly low 16.3 nm.

TABLE 2

Roughness Measurements

| No. of layers | Deposition temperature(s)(° C.) | RMS Roughness (nm) |
|---|---|---|
| 1 | 615 | 70.7 |
| 8 | 580/615 | 16.3 |

It is surprising and remarkable that the outer surface of the eight-layer assembly exhibited such a smooth finish, particularly as compared to the single layer. It will be appreciated that the microstructure of the single layer, and of the outermost layer of the multi-layer assembly were generally the same-predominantly columnar, since both layers were deposited at the same deposition temperature, 615° C.

Although the multi-layer thin film assemblies of the present invention can be formed via numerous processes, it is preferred that they be formed by chemical vapor deposition techniques.

Chemical vapor deposition (CVD) or thermal CVD is the deposition of atoms or molecules from a chemical vapor precursor, which contains the film material to be deposited. Chemical vapor precursors include chlorides such as titanium tetrachloride, $TiCl_4$; fluorides such as tungsten hexafluoride, $WF_6$; hydrides such as silane, $SiH_4$; carbonyls such as nickel carbonyl, $Ni(CO)_4$; and many others. Besides silane ($SiH_4$), polysilicon layers can be produced by CVD of dichlorosilane ($SiCl_2H_2$), or silicon tetrachloride ($SiCl_4$). Any of these gases can be used alone or with hydrogen. Decomposition of the vapor is preferably by chemical reduction or thermal decomposition. The reduction is normally accomplished by hydrogen at an elevated temperature. Some vapors, such as the carbonyls, can be thermally decomposed at relatively low temperatures. The deposited material may react with gaseous species such as oxygen, with a hydrocarbon gas such as methane or ammonia, or with a codeposited species to give compounds such as oxides, nitrides, carbides, and borides.

One such CVD chemical reaction is that of silane:

$$SiH_4(g) \rightarrow Si(s) + 2H_2(g)$$

which is a decomposition reaction.

CVD reactions are most often produced at ambient pressure in a freely flowing system. The gas flow, mixing, and stratification in the reactor chamber can be important to the deposition process. CVD can also be performed at low pressures (LPCVD) and in ultrahigh vacuum (UHVCVD) where the gas flow is molecular. The gas flow in a CVD reactor is very sensitive to reactor design, fixturing, substrate geometry, and the number of substrates in the reactor, i.e., reactor loading.

The CVD process is accomplished using either a hot-wall or a cold-wall reactor as known in the art. In the former, the whole chamber is heated and thus a large volume of processing gases is heated as well as the substrate. In the latter, the substrate or substrate fixture is heated, often by inductive heating. This heats the gas locally.

The gas flow over the substrate surface establishes a boundary layer across which precursor species must diffuse in order to reach the surface and deposit. In the cold-wall reactor configuration, the boundary layer defines the temperature gradient in the vapor in the vicinity of the substrate. This boundary layer can vary in thickness and turbulence, depending on the direction of gas flow. Direct impingement of the gas on the surface reduces the boundary layer thickness and increases the temperature gradient, whereas stagnant flow regions give much thicker boundary layers.

Each heating technique has its advantages and disadvantages, and changing from one technique to another may involve significant changes in the process variables. The cold-wall reactor is most often used in small size systems. The hot-wall reactor, by contrast, is most often used in large volume production reactors.

CVD processing can be accompanied by volatile hot reaction by-products such as HCl or HF, which, along with unused precursor gases, must be removed from the exhaust gas stream. This is done by scrubbing the chemicals from the gas using water to dissolve soluble products or by burning the precursor gases to form oxides.

In many cases, the deposited material can retain some of the original chemical constituents, such as hydrogen and silicon from the deposition from silane, or chlorine and tungsten from the deposition from $WCl_6$. This can be beneficial or detrimental. For example, the retention of hydrogen and silicon allows the deposition of amorphous silicon, a-Si:H, which is used in solar cells.

The gases used in the CVD reactor may be either commercially available gases in tanks, such as Ar, $N_2$, $WF_6$, $SiH_4$, $B_2H_6$, $H_2$, and $NH_3$; liquids such as chlorides and carbonyls; or solids such as Mo carbonyl, which has a vapor pressure of 10 Pa (75 mtorr) at 20° C. and decomposes at temperatures greater than about 150° C. Vapor may also come from reactive bed sources where a flowing halide, such as chlorine, reacts with a hot-bed material, such as chromium or tantalum, to give a gaseous species.

Vapor from liquids can be put into the gas stream by bubbling the hydrogen or a carrier gas through the liquid or by using a hot surface to vaporize the liquid into the gas stream. Liquid precursors are generally metered onto a hot surface using a peristaltic pump and the gas handling system is kept hot to keep the material vaporized. In some cases, the vapor above a liquid may be used as the gas source.

Reactive bed sources use heated solid materials, e.g., chips and shavings, over which a reactive gas flows. The reaction produces a volatile gaseous species that can then be used as the precursor gas. By controlling the reaction bed parameters, the stoichiometry of the resulting gas can be controlled.

The morphology, composition, crystalline structure, defect concentration, and properties of CVD-deposited material depend on a number of factors. An important variable in the CVD reaction is the effect of vapor supersaturation over the substrate surface and the substrate temperature. At low supersaturations, which also give a low deposition rate, nuclei initiate on isolated sites and grow over the surface, giving a high density film. At high temperatures and low supersaturations of the vapor, epitaxial growth (oriented overgrowth) can be obtained on appropriate substrates. This vapor phase epitaxy (VPE) growth is used to grow doped layers of semiconductors, e.g., Si doped with B on Si. At intermediate concentrations, a nodular growth structure may form.

Many materials deposited by CVD have a high elastic modulus and a low fracture toughness and are therefore affected by residual film stresses. Film stress arises owing to the manner of growth and the coefficient of expansion mismatch between the substrate and film material. In many CVD processes, high temperatures are used. This restricts the substrate coating material combinations to ones where the coefficient of thermal expansions can be matched. High temperatures often lead to significant reaction between the deposited material and the substrate, which can also introduce stresses.

Processing variables that affect the properties of the thermal CVD material include the precursor vapors being used, substrate temperature, precursor vapor temperature gradient above substrate, gas flow pattern and velocity, gas composition and pressure, vapor saturation above substrate, diffusion rate through the boundary layer, substrate material, and impurities in the gases.

Safety is often a primary concern in CVD processing because of the hazardous nature of some of the gases and vapors that are used and the hot reaction products generated.

The density of CVD deposits is generally high (>99%), but dendritic or columnar growth can decrease the density. High purity films can be attained but incomplete decomposition of the precursor gases can leave residuals in the deposits particularly at low deposition temperatures. The CVD deposition process, is overall, relatively attractive, but the properties of the deposit often depend on deposition rate, gas flow impingement rate and direction. CVD deposition rates can range from less than 10 to more than 300 microns/ hour and generally have no restriction on thickness. The thickness of a CVD deposit is determined by the processing parameters and can range from very thin films to thick coatings to free-standing shapes.

The microstructure and crystallographic texture of polysilicon deposited by LPCVD (usually involving the thermal decomposition of silane) is determined mainly by the deposition temperature and the partial pressure of the reactant gases (e.g. silane) and to a lesser extent the presence of hydrogen carrier gas. It is generally believed that at low deposition temperatures and high silane pressures, the deposited films are initially amorphous and subsequently crystallize, i.e. become devitrified. As the temperature is increased and the silane pressure decreased, the films become columnar or predominantly columnar with regimes of preferred orientation that change from (311) to (110) to (100) and finally to a random orientation at the highest temperatures and lowest pressures. At a typical silane pressure of 300 mtorr, films deposited below 580° C. are devitrified. At such pressures, films deposited at temperatures from 580° C. to 600° C. are predominantly columnar with a (311) texture. At the same pressures, films deposited at temperatures from 600° C. to 700° C. exhibit a (110) texture and a columnar microstructure on top of an initial equiaxed nucleation layer. And, at such pressures, films deposited above 700° C. are predicted to have a (100) texture and a columnar microstructure. However, these specific deposition parameters are only approximate and will vary between different deposition systems. For example, some researchers never encounter the (311) texture regime (that is the case for the preferred embodiment films deposited at 580° C. and described herein), while others have reported varying microstructures among films deposited on different wafers within the same furnace. Furthermore, these aspects depend upon the thickness of the respective layers.

Previous reports have stated that any depositions below 580° C. will be amorphous. However, the present inventors have found that films deposited at 570° C. and 580° C. have devitrified microstructures, while films deposited at 550° C. are amorphous and generally remain amorphous unless films thicker than about 2 $\mu$m are formed or unless films are heated during subsequent processing to temperatures of approximately 570° C. or above. It is likely that for any pressure between about 100 to about 500 mtorr, similar trends will be observed. The present inventors currently believe that 570° C. may be the optimum temperature for forming the devitrified layers as described herein. This temperature is high enough so that the deposition rate is acceptable, and it is low enough that there should be no columnar nature to these layers. However, depending upon other process and system parameters, it is contemplated that deposition temperatures from about 550° C. to about 590° C. may be utilized to form the devitrified layers described herein. Deposition at any temperature between about 600° C. and about 700° C., preferably about 605° C. to about 650° C., and most preferably about 615° C., should result in a columnar, or at least predominantly columnar polysilicon film exhibiting compressive stress.

Preferably, during the deposition of the various layers in forming the multi-layer assembly, temperature adjusting equilibrium time periods are employed between deposition of the individual layers. This practice ensures that the substrate or partially formed multi-layer assembly is at a common and uniform temperature, and that the temperature is the desired deposition temperature. For example, if the temperature of the substrate or stack is at 570° C., and it is desired to deposit the next layer at 615° C., the temperature is ramped up to that temperature within a time period of about 25 minutes. Then, the next layer is deposited at the desired higher temperature, i.e. 615° C. After completion of the formation of that layer, if it is then desired to deposit another layer at a lower temperature, for instance, 570° C., another temperature adjusting time period is allowed to pass. In the case of having previously deposited a layer at 615° C. and desiring to next deposit a layer at 570° C., the present inventors have determined that a suitable temperature cooling period is about 30 minutes. The optimal temperatures and adjusting time periods may vary depending on the LPCVD equipment used.

As described herein, films deposited in the transition region between the amorphous and columnar regimes contain randomly oriented very small (~0.1 $\mu$m) crystallites.

The devitrified microstructure is believed to arise from crystallization (via homogeneous nucleation) of the amorphous silicon film during the later stages of the deposition, or during subsequent heat treatment. This explanation is supported by observations that partially crystallized films are only crystallized at the bottom (substrate interface) region but amorphous at the external face (gas interface). Furthermore, slightly coarser devitrified microstructures result from fine-grained devitrified films which are subsequently annealed at elevated temperatures to induce grain coarsening.

Most importantly for microelectromechanical applications, these fine-grained devitrified polysilicon films exhibit tensile residual stresses, while the coarser polycrystalline columnar films deposited at higher temperatures exhibit compressive residual stresses. The tensile stresses in the fine-grained devitrified polysilicon are believed to result from the volume change during crystallization from the amorphous state. The compressive stresses in the polysilicon deposited at high temperatures are not well understood, though hydrogen incorporation has been postulated as part of the cause since the stresses in both the nucleation and columnar layers are similar. Relatively thick columnar films display a much rougher surface than fine-grained films, due to the semi-spherical morphology of the peaks of the individual columnar grains.

The present invention provides a novel technique of utilizing multiple layers of LPCVD or CVD polysilicon deposited at varying temperatures, such that a composite film is formed which is comprised of alternating tensile and compressive layers. Thin films of polysilicon having a generally devitrified structure and an inherent tensile stress may be formed by CVD of silane at a temperature of about 570° C. Thin films of polysilicon having a generally predominantly columnar structure and an inherent compressive stress may be formed by CVD of silane at a temperature of about 615° C. In this manner, if the thicknesses of each of the individual layers are appropriately controlled, the overall stress of the polysilicon may range between that of a tensile fine-grained layer and a compressive columnar layer. The present inventors have demonstrated this unique and remarkable discovery by forming multiple layer films having overall residual levels of stress of zero, or substantially so.

Figure 2:
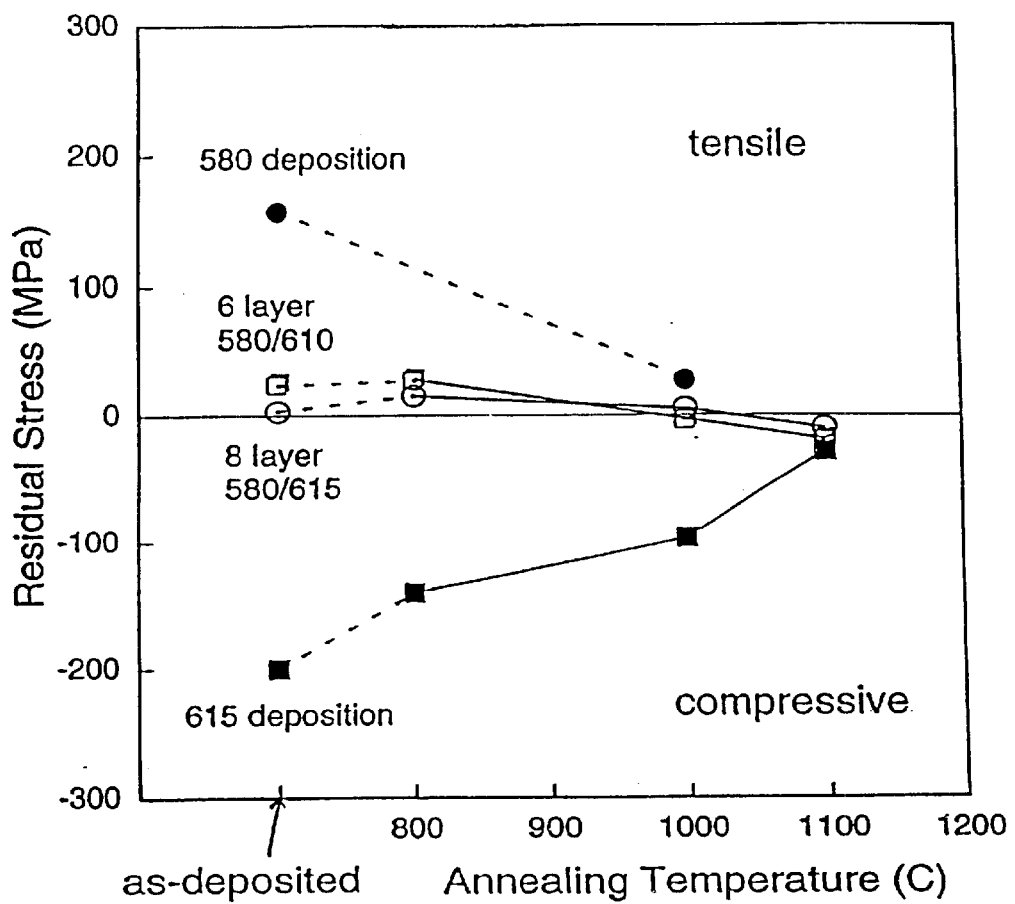
FIG. 2 is a graph illustrating stress in multi-layer polysilicon films as a function of annealing temperature.

In accordance with the present invention, polysilicon films were deposited via LPCVD in a hot-walled furnace using silane at a pressure of 300 mtorr and a flow rate of 100 sccm at temperatures from 550° C. to 615° C. Some of the films were studied in the as-deposited state, while other films were annealed in flowing nitrogen for one hour at various temperatures. The stresses of the newly deposited and annealed films were measured as shown in FIG. 2 using a laser-reflected wafer curvature technique. The film deposited at 580° C. was at least partially crystalline as-deposited, as determined by x-ray diffraction and transmission electron microscopy (TEM) of cross-sectional samples, and was about 5 microns thick, utilizing a deposition time of 1100 minutes. The film deposited at 615° C. was about 5 microns thick, had a columnar microstructure, and utilized a deposition time of 600 minutes. A six layer film was deposited by varying the temperature in the furnace between 610° C. (for the odd layers) and 580° C. (for the even layers). While the temperature was ramping, the silane flow was stopped. The total thickness was 3.6 microns, using a deposition time of 194 minutes for each odd layer and 125 minutes for each even layer. An eight layer film was deposited in the same fashion as the six layer film, except that the even layers were deposited at 615° C. for 125 minutes each, and there were 2 additional layers. The total thickness was also 3.6 microns.

As seen in FIG. 2, the preferred embodiment polysilicon films deposited at 580° C. and 615° C. in accordance with the present invention, display tensile and compressive as-deposited residual stresses, respectively. The six layer film exhibits a low tensile stress, about 30 MPa, and the eight layer film exhibits a near-zero residual stress. Although annealing alters the stresses of the polysilicon films deposited at a single temperature, the near-zero stress state of the eight layer film is extremely stable up to 1000° C. Such stability demonstrates the immunity and resistance of the layered film to further process steps and enhances its value for microelectromechanical processing. The use of several (6 or 8) thin layers to create a thick film has an additional important advantage in that the procedure reduces the surface roughness by preventing columnar grains from developing rounded crests.

Figure 3:
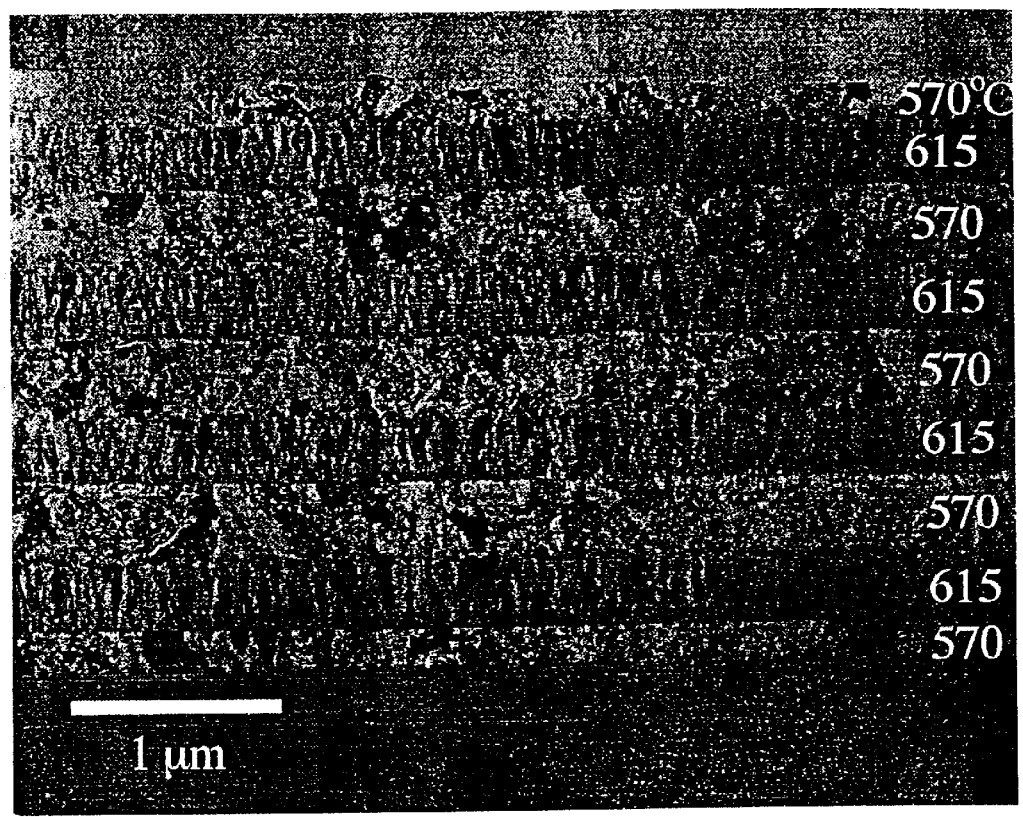
FIG. 3 is a transmission electron micrograph of a cross section of a preferred embodiment nine layer polysilicon film in accordance with the present invention.

FIG. 3 is a cross-sectional transmission electron micrograph of a preferred embodiment nine layer film in accordance with the present invention. The fine grained microstructures of the odd layers and the columnar microstructure of the even layers are apparent. It is significant that the multi-layer assembly shown in FIG. 3 does not require, and thus does not utilize, any type of intermediate layer(s) between the alternating layers of polysilicon.

Figure 4:
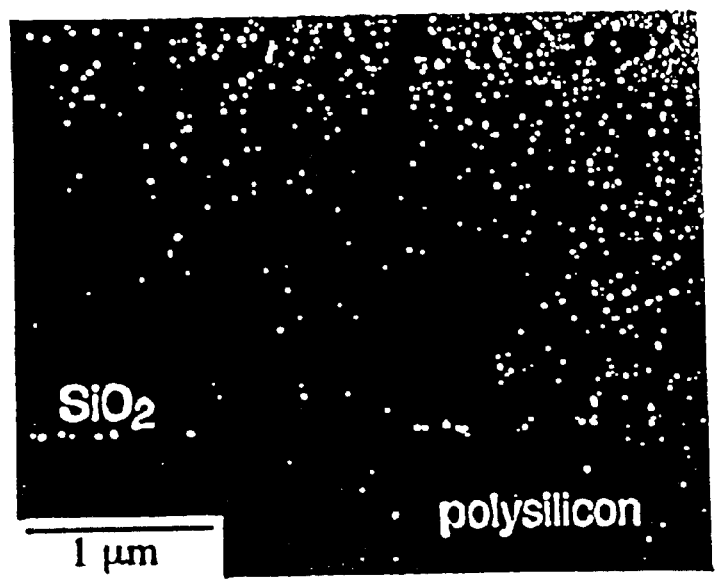
FIG. 4 is a transmission electron micrograph of a cross section of a preferred embodiment single, generally devitrified layer of polysilicon deposited at a temperature of 580° C.

Similarly, FIG. 4 is a transmission electron micrograph of a cross section of a preferred embodiment single, generally devitrified layer of polysilicon formed at 580° C. A neighboring region (shown on the left hand side of FIG. 4) of silicon dioxide is shown. FIG. 4 demonstrates that the process of devitrification is slightly slower than the rate of film growth or deposition.

Figure 5:
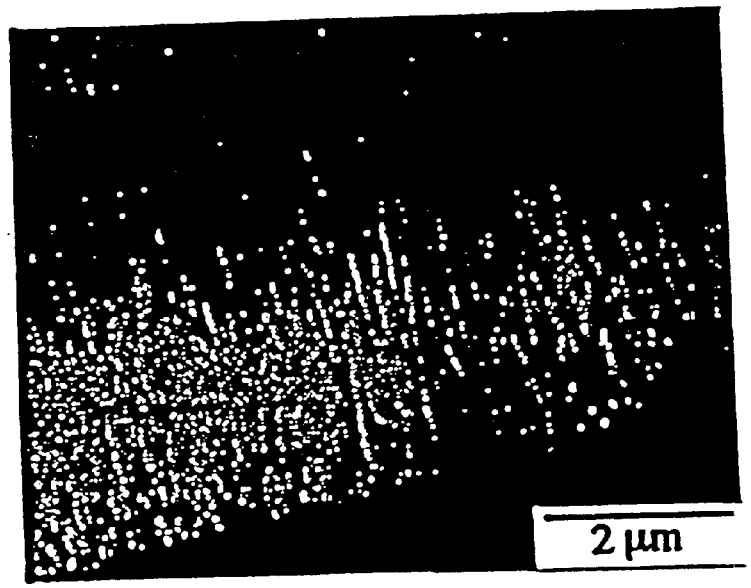
FIG. 5 is a transmission electron micrograph of a cross section of a preferred embodiment single, generally predominantly columnar layer of polysilicon deposited at a temperature of 615° C.

FIG. 5 is a transmission electron micrograph of a cross section of a preferred embodiment single, generally columnar layer of polysilicon formed at 615° C.

By using alternating layers of tensile and compressive polysilicon, films can be deposited and imparted with any stress value between those of the individual layers.

While the multi-layer thin film assembly shown in FIG. 3 has a zero overall residual stress, the thicknesses of the individual polysilicon layers can be adjusted to achieve any overall film stress which lies between the individual 570° C. tensile and 615° C. compressive polysilicon film stresses, which film stresses are in the range of about 300 to 350 MPa.

Figure 19:
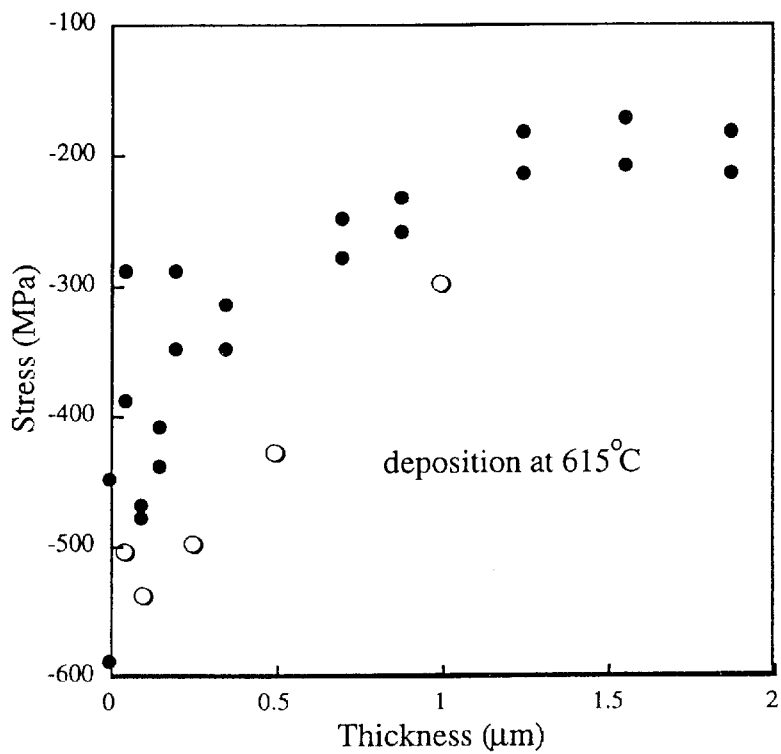
FIG. 19 is a graph of stress as a function of film thickness for polysilicon deposited at 615° C.
Figure 20:
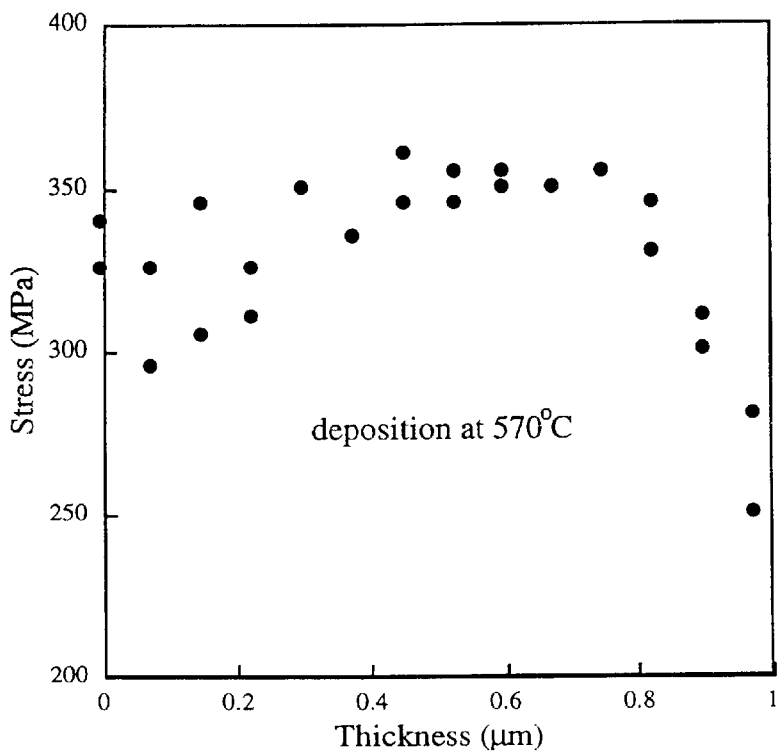
FIG. 20 is a graph of stress as a function of film thickness for polysilicon deposited at 570° C.

Actually, regardless of whether the residual stress is tensile (570° C. deposition) or compressive (615° C. deposition), the stress in any layer whose thickness is less than approximately 1 $\mu$m primarily depends on the layer thickness. The stress profile for a single tensile layer deposited at 570° C. is shown in FIG. 20, while the stress profile of a single compressive layer is shown in FIG. 19. These figures are described in greater detail herein. As can be seen, the tensile stress increases from approximately 300 MPa in very thin films to a maximum stress of about 360 MPa for 0.6 $\mu$m films. Very thin compressive layers have residual stresses as high as about 550 MPa, which decrease to stress levels of about 200 MPa for layer thickness of 0.8 $\mu$m and above.

These residual stress gradients have been of great concern in the field of microelectromechanical systems and must also be considered in MultiPoly™ assemblies. To explain this, it is best to consider single layer films first. The stress gradients of either the tensile or compressive polysilicon films shown herein would cause structures comprised of these films to bend upwards away from their underlying substrates, when released from their respective substrate.

This is due to a greater tensile stress at the top of the film in the case of the 570° C. polysilicon, and due to a greater compressive stress at the bottom of the film in the case of the 615° C. polysilicon. However, it is possible to control the residual overall stress gradient in MultiPoly™ assemblies, by careful control of the thickness of both types of layers or thin films. In fact, MultiPoly™ assemblies can be formed to exhibit any value of stress gradient which lies between zero and the stress gradient of a bi-layer consisting of one 570° C. polysilicon layer and one 615° C. polysilicon layer. Furthermore, the gradient can be either positive or negative.

At this juncture, it is instructive to consider a brief review of how stresses imparted or exhibited within a layer or region of material may distort or induce a change in the geometrical configuration of the layer or region of material. Reference is made herein to the bending moment of a particular thin layer or region of multi-layer assembly under review. Generally, the bending moment of a layer or thin film is equal to the sum of the external forces and moments acting upon the layer. Restated, the bending moment is equal to the moment of the internal stress forces at the layer. This moment may be approximated by multiplying the stress associated with the layer by the distance between that layer and what is often referred to as the bending axis described below.

For multi-layer thin film assemblies that exhibit non-zero bending moments, an axis around which the bending moment can be taken exists, which is referred to herein as the bending axis.

A significant aspect of the bending axis is that its location affects the computation of the overall bending moment of the assembly. This is because the stress intensity at any region in the assembly varies directly with the distance between the region of interest and the bending axis.

The overall bending moment of a multi-layer thin film assembly may be approximated by algebraically summing together the individual bending moments associated with each of the thin films in the assembly. The bending moment of each individual layer or thin film is approximated by multiplying the stress associated with that layer by the distance that layer is from the bending axis. For many of the multi-layer assemblies described herein, the bending axis corresponds to the midpoint of the thickness of the assembly.

Another aspect of the present invention relates to a remarkable discovery by the present inventors that overall stresses and gradients within a multi-layer assembly can be brought into desired specifications by depositing one or more additional layers. Preferably, these one or more additional layers are relatively thin, such as for instance from about 1 nm to about 1000 nm, and more preferably from about 10 nm to about 500 nm. And, it is preferred that these one or more additional layers be located at or on the outermost layer of the multi-layer assembly so that the one or more additional layers are as far as possible away from the neutral plane of the assembly. These aspects are described in greater detail herein, particularly in Example 4.

Figure 6:
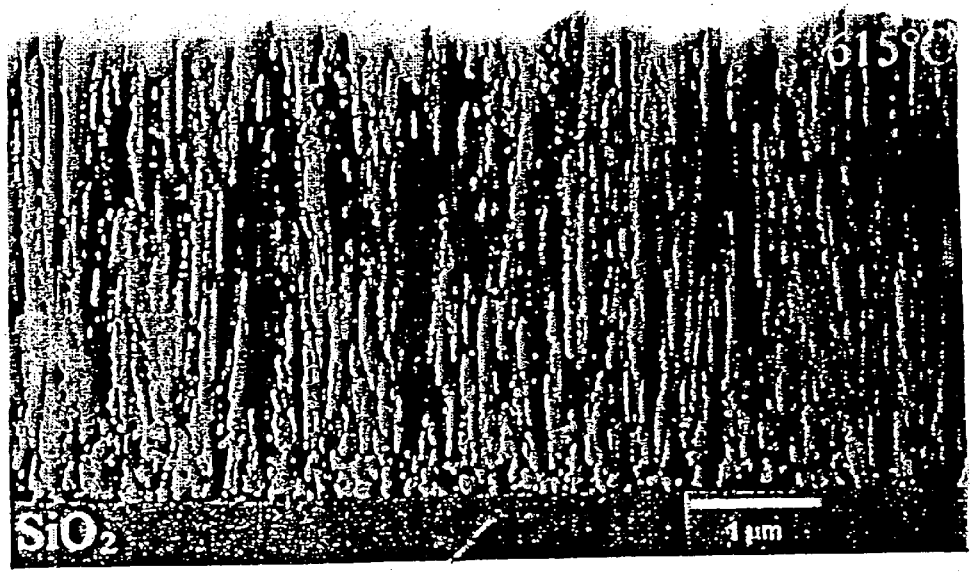
FIG. 6 is a transmission electron micrograph of a cross section of a single layer film deposited at 615° C.
Figure 7:
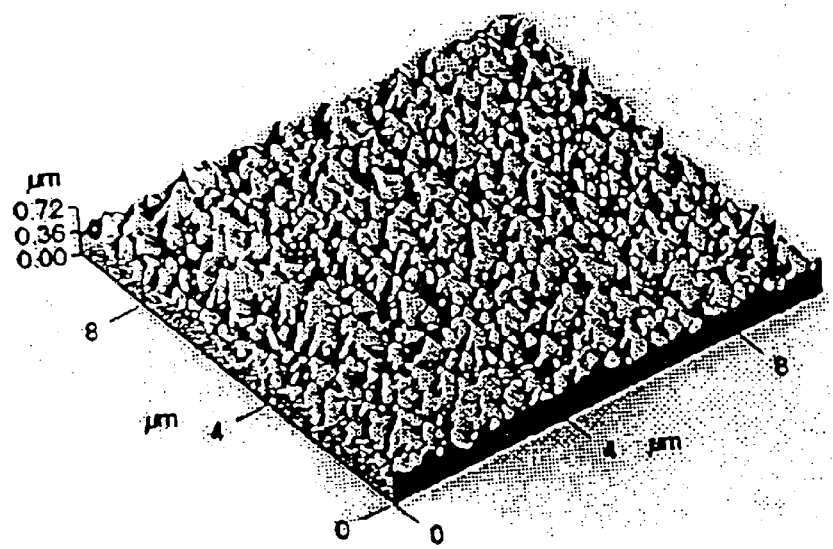
FIG. 7 is an AFM image of a surface of the single layer film illustrated in FIG. 6.
Figure 8:
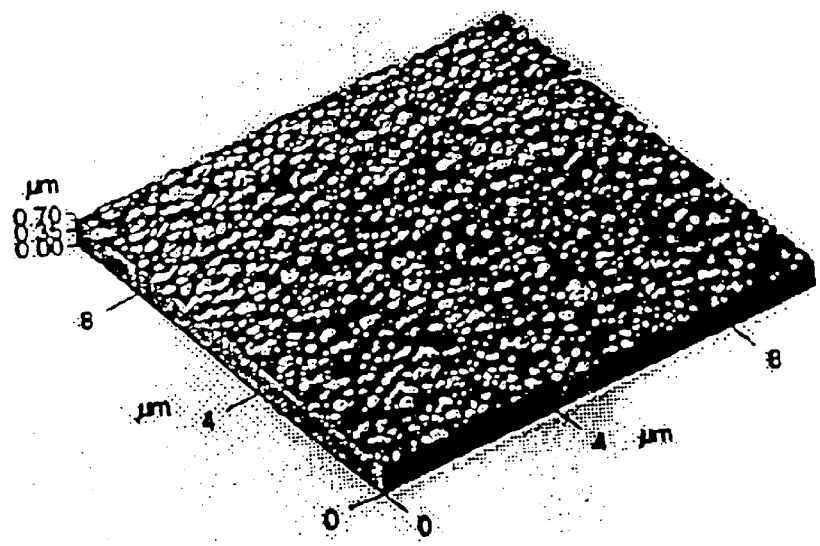
FIG. 8 is an AFM image of a surface of an outermost layer of a preferred embodiment multi-layer assembly.

As previously noted, the MultiPoly™ process has yet another very useful attribute. FIG. 6 illustrates a relatively thick (about 4 $\mu$m) single layer film deposited at 615° C. This film was deposited at that temperature for 466 minutes. Due to the columnar microstructure, the as-deposited surface finish is rather poor, and an AFM determination of the surface roughness (FIG. 7) yields a RMS roughness of 70.7 nm. In contrast, a MultiPoly™ assembly with the microstructure of FIG. 3 has a mirror finish and a RMS surface roughness of 16.3 nm (FIG. 8). Films deposited at 570° C. are initially amorphous and very smooth. During film growth, crystallization occurs, but does not change the surface finish. Deposition of amorphous silicon is conformal. Such deposition and the fact that the development of this columnar microstructure of the 615° C. layers is impeded results in the much improved surface finish of the MultiPoly™ silicon.

In accordance with the present invention, RMS surface finishes for the thin layer films described herein, of less than about 60 nm, preferably less than about 50 nm, and most preferably less than about 25 nm are obtainable. As described herein, such smooth surface finishes are produced upon layer formation and avoid the requirement for post forming operations such as conventional smoothing techniques. As described herein, such smooth outer surfaces result from a choice of microstructure (e.g. devitrified) in the outermost layer, and using relatively thin layers, particularly as the outermost layer. This improved surface finish has salutary consequences for the optical MEMS applications noted herein. Before discussing these applications, however, one other most useful aspect of the MultiPoly™ process must be discussed.

For many applications, the advantages of the MultiPoly™ process result from the ability to produce very large and very flat surface micromachined structures, through control of both the residual stress and residual stress gradients. However, residual stress gradients may be designed or selectively formed so that useful shaped components may be produced upon release of the multi-layer assembly from an underlying substrate.

As an example of this technique, a 2 $\mu$m thick polysilicon film can be designed such that a 500 $\mu$m diameter circle etched from this film will display a semi-circular shape with a radius of curvature of 2 mm, when released from the substrate. This film can be formed by depositing the following seven multi-layers, followed by a one hour anneal at 615° C. to fully crystallize the last layer:

1) a 0.09 $\mu$m film deposited at 570° C.
2) a 0.31 $\mu$m film deposited at 615° C.
3) a 0.36 $\mu$m film deposited at 570° C.
4) a 0.31 $\mu$m film deposited at 615° C.
5) a 0.37 $\mu$m film deposited at 570° C.
6) a 0.32 $\mu$m film deposited at 615° C.
7) a 0.24 $\mu$m film deposited at 570° C.

When provided with a reflective coating, such as a thin sputtered film of gold, this circle can serve as a focusing mirror. In particular, if the circular mirror remains attached to the substrate at a single point, such as its center, it can be used as a collimating mirror in conjunction with optical fibers as a component in micro-optomechanical devices.

In addition, if an electrical connection is made to the mirror, and a separate electrode is formed on the substrate beneath the mirror, a voltage applied between the two electrodes would create an electrostatic attraction between them. In this manner, it would be possible to cause the mirror to be pulled flat against the substrate, and any optical beam which had been focused by the mirror would become de-focused. This feature would allow the mirror to act as an active optical switch. It is contemplated that a 0.7 $\mu$m thick, 500 $\mu$m diameter mirror, again with a radius of curvature of 2 mm, would become planar at an electrostatic field corresponding to a 15 V potential difference between the film and the substrate.

In yet another series of trials, various multi-layer thin film assemblies were prepared having from 5 to 10 thin film layers. In producing each stacked assembly, particular pairings of deposition temperatures were used, as set forth below. Upon forming each assembly, the overall residual stress and the overall residual stress gradient were measured and are shown in Table 3.

TABLE 3

| Trial | No. of Layers | Temperatures (° C.) | Stress (Mpa) (+ Is tensile) (Includes 1–2 hr. anneal at 616° C.) | Gradient (MPa/μm) (+ Is bending down) |
|---|---|---|---|---|
| 1 | 6 | 580/610 | 25 | |
| 2 | 8 | 580/615 | 3 | |
| 3 | 8 | 550/615 | −40 | |
| 4 | 9 | 570/615 | 7 | −18 |
| 5 | 9 | 615/570 | −21 | −40 |
| 6 | 5 | 570/615 | −100 | 40 |
| 7 | 5 | 570/615 | −4 | −100 |
| 8 | 8 | 570/615 | −30 | −35 |
| 9 | 9 | 570/615 | −13 | 2.6 |
| 10 | 10 | 570/615 | −8 | −0.2 |

As will be noted, multi-layer assemblies having a wide range of overall stresses were produced, i.e. from −100 to 25 MPa. And, a wide range of overall stress gradients were produced, i.e. −100 to 40 MPa/μm.

Another phenomenon related to the present invention relates to deposition of polysilicon at a specific temperature at the transition between the as-deposited amorphous and as-deposited crystalline regions. Such deposition leads to a silicon thin film which is devitrified (tensile) at the bottom and amorphous (compressive) at the top. If performed properly, this could lead to an overall zero-stress film. However, this technique is extremely difficult to control. Other drawbacks of this technique are that it precludes any further processing at higher temperatures, and it can never produce a zero-stress gradient film. Therefore, this is an inferior strategy to the preferred embodiment of the present invention method described herein.

EXAMPLES

The following examples are provided to further illustrate various aspects of the present invention.

Example 1
Formation of a 3.0 Micron Thick Film with an Overall Stress of 7 MPa Tensile, Using 9 Layers A first devitrified polysilicon layer is formed by silane deposition at 570° C., deposition occurring for 59 minutes. A 25 minute heating period is used to allow the substrate to reach a temperature of 615° C. Then, a 54 minute deposition period is used to form the second layer, a predominantly columnar layer. A 30 minute cooling period is used to allow the substrate and layers to cool to 570° C. Then, the third layer is formed by silane deposition for a period of 118 minutes at 570° C. The foregoing process is repeated to form layers 4 (54 minutes deposition at 615° C.), 5 (118 minutes deposition at 570° C.), 6 (54 minutes deposition at 615° C.), 7 (118 minutes deposition at 570° C.), and 8 (54 minutes deposition at 615° C.). The top and last layer, layer 9, is formed in a similar fashion as the first layer, layer 1. Layer 9 is preferably formed by using a deposition time period of 59 minutes at 570° C. It is instructive that the time period for deposition of the first and last layers is each about 59 minutes, which is one-half the deposition time for each of layers 3, 5, and 7. This provides for selectively producing an overall desired stress characteristic while also providing a relatively smooth outer finish.

Example 2
Formation of a 2.8 Micron Thick Film with an Overall Stress of 17 MPa Tensile, Using 9 Layers The same procedure may be utilized as previously described with regard to Example 1 with the exception that instead of utilizing a deposition time of 54 minutes for layers 2, 4, 6, and 8, a shorter time period of 51 minutes is employed.

Example 3
Formation of a 0.4 Micron Thick Film with an Overall Stress of 2 MPa Tensile, Using 3 Layers A first polysilicon layer is formed by silane deposition for 46 minutes at 550° C. Prior to this a 25 minutes heating period is utilized to ensure that the receiving substrate is at a uniform temperature of 550° C. After deposition of the first layer, another 25 minute heating period is employed to ensure that the assembly is at a temperature of 615° C. The second layer is then formed by silane deposition for 24 minutes at 615° C. Afterwards, a 30 minute cooling period is used to bring the assembly to a temperature of 550° C. The third layer is then formed by silane deposition for 46 minutes at 550° C. The resulting assembly is annealed for 2 hours at 615° C.

Example 4
Formation of Multi-layer Films Having Near Zero Stress and Near Zero Stress Gradients A collection of multi-layer polysilicon assemblies were prepared. The substrates used were 100 mm diameter (100) silicon wafers onto which relatively thick (2.2 μm) $SiO_2$ films were thermally grown. The polysilicon films were deposited by LPCVD, using silane at a flow rate of 100 sccm and a pressure of 300 mtorr. For multi-layer depositions, the silane flow was shut off following deposition of each individual layer, and the reactor was allowed to stabilize at the new deposition temperature before the silane was re-introduced. Thicknesses were measured optically using a Nanospec spectrophotometer, while surface roughness was measured by atomic force microscopy (AFM), and texture was measured by conventional x-ray diffraction. Microstructures were determined primarily using cross-sectional and plan view transmission electron microscopy (XTEM and TEM, respectively). Residual stresses were determined by measuring the curvature of the wafers before and after film deposition, using a laser measurement system (Frontier Semiconductor Measurement). For each stress measurement, six scans were performed across the wafer surface, rotating the wafer by 30 degrees between each scan. The repeatability of this technique was studied by successive measurements on the same wafer and was within ±2 MPa.

To quantify the stress gradients, the deflections of 310 μm long, 4 μm wide cantilever beams were measured using optical interferometry. The (dark and light) thickness fringes were spaced at 135 nm intervals. This "coarseness" in measured deflection corresponds to an uncertainty in stress gradient of 0.5 MPa/μm. These beams were fabricated as follows. A 1 μm thick film of $SiO_2$ was deposited on the polysilicon film by LPCVD, using silane and oxygen at 450° C. This oxide was photolithographically patterned and etched in a $CHF_3/C_2F_6$ plasma, and the oxide was used as a mask to etch the polysilicon in a $Cl_2$ plasma. The structures were released by etching the underlying $SiO_2$ layer in concentrated HF. Any remaining masking oxide was simultaneously etched.

As discussed below, the stress gradients were measured in devitrified films deposited at 570° C. and crystallized at 615° and in columnar films deposited at 615° C. For this purpose, films were deposited on both surfaces of a 100 mm silicon wafer. $Cl_2$ dry etching was used to gradually reduce the film thickness of one surface, with concomitant determination of the film stress using the wafer curvature technique.

Figure 9:
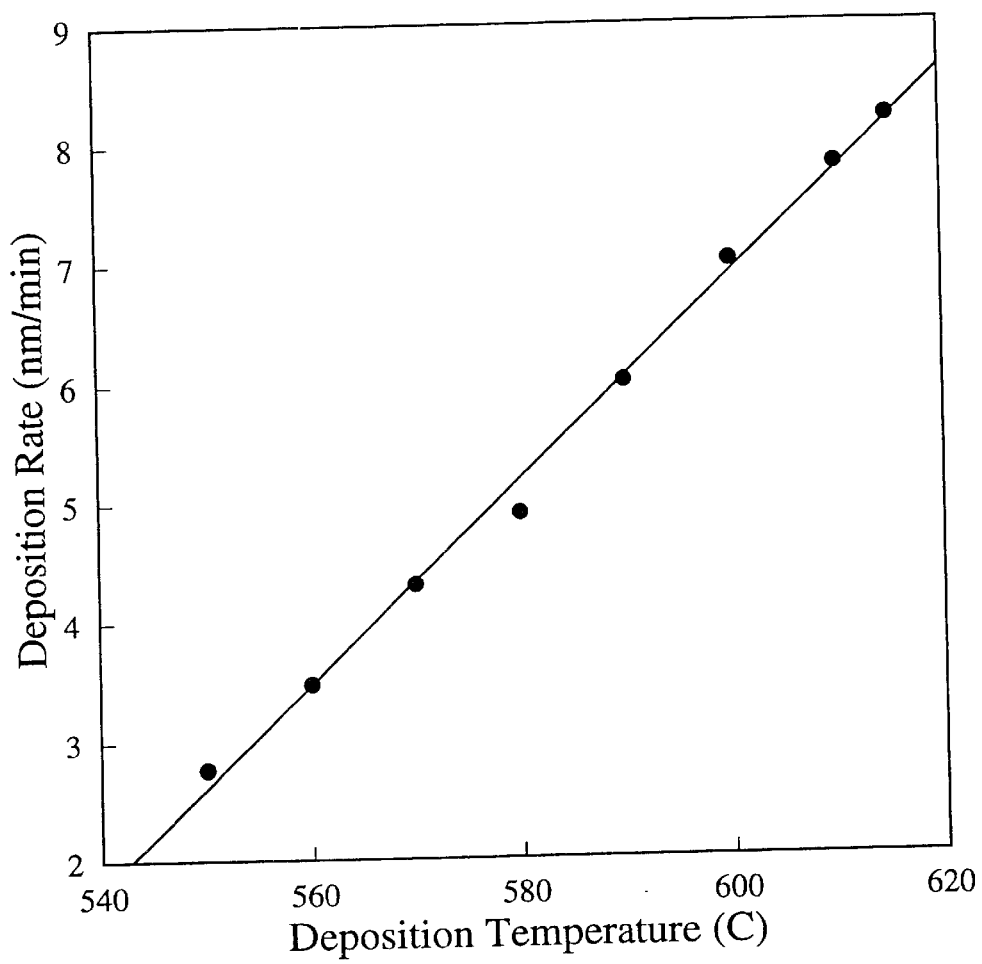
FIG. 9 is a graph illustrating polysilicon deposition rates at various temperatures.
Figure 10:
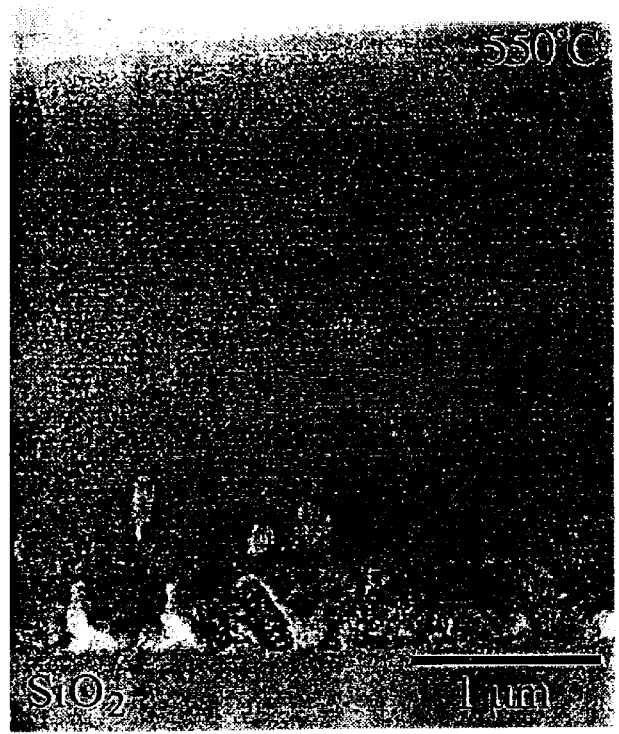
FIG. 10 is a micrograph of a polysilicon film deposited at 550° C. for 1200 minutes.
Figure 11:
FIG. 11 is a micrograph of a polysilicon film deposited at 570° C. for 709 minutes.

LPCVD deposition rates are plotted versus deposition temperature in FIG. 9 in a linear plot. The deposition rate increases from 2.8 nm/min at 550° to 8.3 nm/min at 615° C. XTEM micrographs of approximately 4 μm thick films grown at 550° C., 570° C., and 615° C. are shown in FIGS. 10, 11, and 6, respectively. The 550° C. film (FIG. 10) is predominantly amorphous, although heterogeneously nucleated silicon crystallites are present at the film/substrate interface, and a few homogeneously nucleated crystallites are present in the lower half of the film. The 570° C. film (FIG. 11) is generally similar, in that the film contains some as-deposited amorphous Si near the growth surface, but the extent of crystallization (devitrification) is much more marked than in the 550° C. film. The 615° C. film (FIG. 6) is fully crystalline and columnar. The $SiO_2$ substrate is the light featureless region along the bottom of each micrograph. X-ray diffraction results reveal that the columnar films are highly (110) textured, and that the fine-grained films have a slightly decreased (100) peak intensity compared to a randomly oriented powder.

Figure 12:
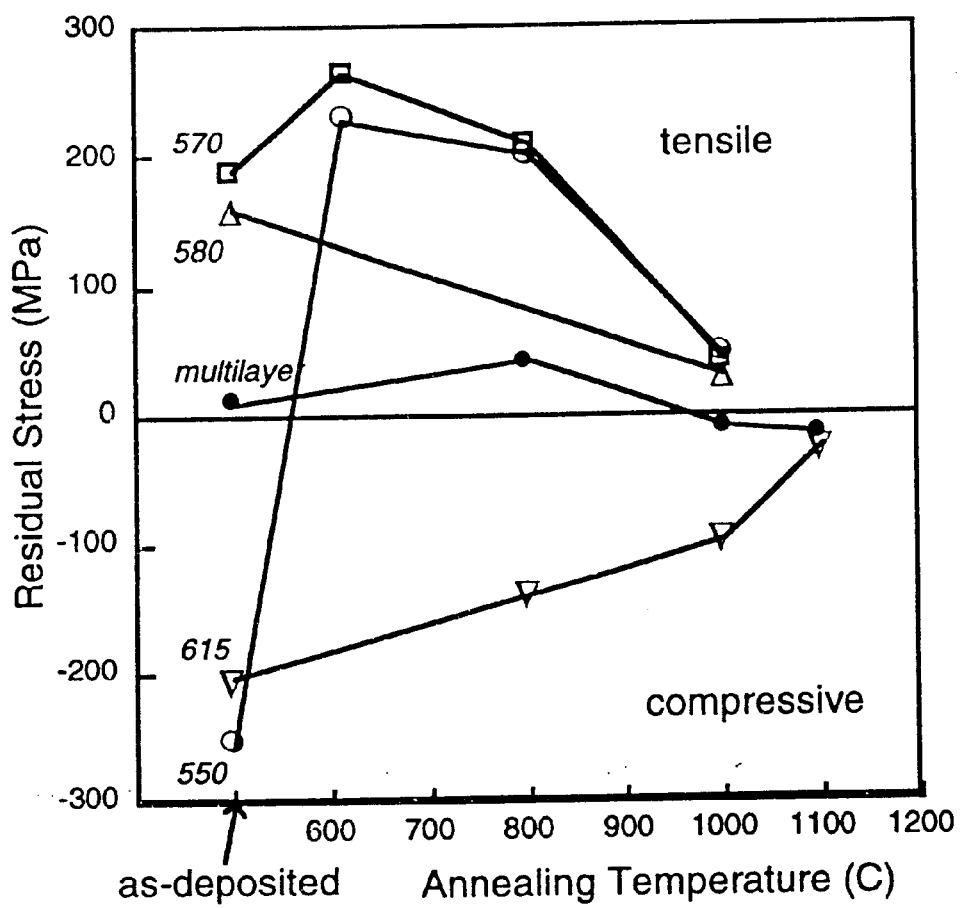
FIG. 12 is a graph of residual stresses of various polysilicon films as-deposited and after annealing for 30 minutes in nitrogen, the single layer films designated by their deposition temperatures.

The residual stresses of approximately 2 μm thick polysilicon films deposited and annealed at varying temperatures are shown in FIG. 12. The stresses were measured as-deposited and after isochronal annealing in nitrogen for 30 minutes between 615° C. and 1100° C. The residual stresses in the crystalline films do not change significantly until the annealing temperature reaches approximately 1000° C., above which the stresses of all films drop to near zero. It should be noted that during the fabrication of the cantilever beams, micro-strain gauges were simultaneously fabricated. Stresses measured using these devices agreed with the curvature-determined stress measurements. The resolution of these latter devices is ±1 MPa.

Annealing at 615° C. was sufficient to fully crystallize any as-deposited amorphous material. This is evident from the stress of the film deposited at 550° C., which changed from highly compressive to highly tensile after the 615° anneal, and by the slight increase in tensile stress for the film deposited at 570° C. and annealed at 615° C., which was partially amorphous as-deposited.

The data labeled "multi-layer" in FIG. 12 were taken from the 2.72 μm thick 9-layer MultiPoly™ film shown in FIG. 6. The 5 "odd" layers were deposited at 570° C. and have thicknesses of 0.18, 0.36, 0.36, 0.36, and 0.18 μm. The 4 "even" layers were deposited at 615° C. and have thicknesses of 0.32 μm. Following deposition, the film was annealed at 615° C. for one hour to fully crystallize the last fine-grained layer.

Figure 13:
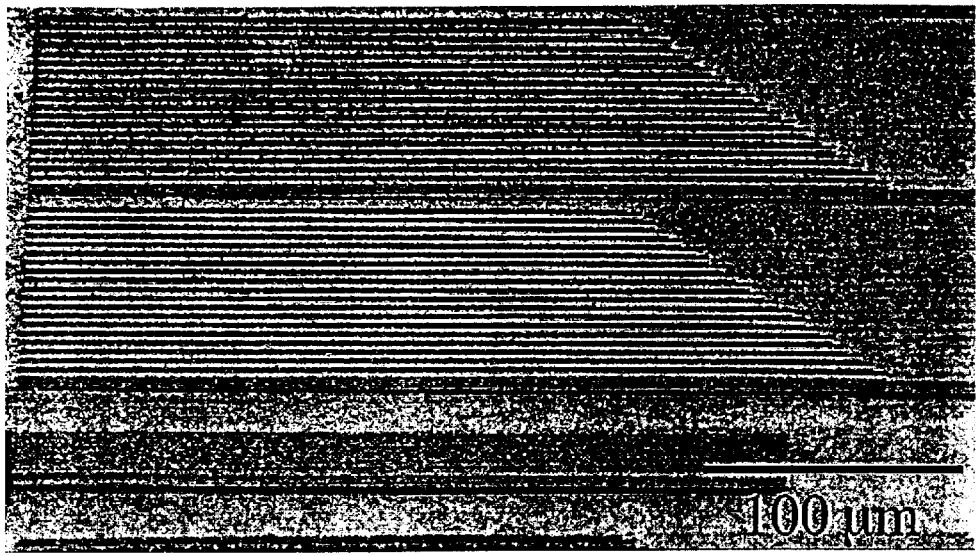
FIG. 13 is a micrograph of surface micromachined cantilever beams fabricated from a nine layer polysilicon film.
Figure 14:
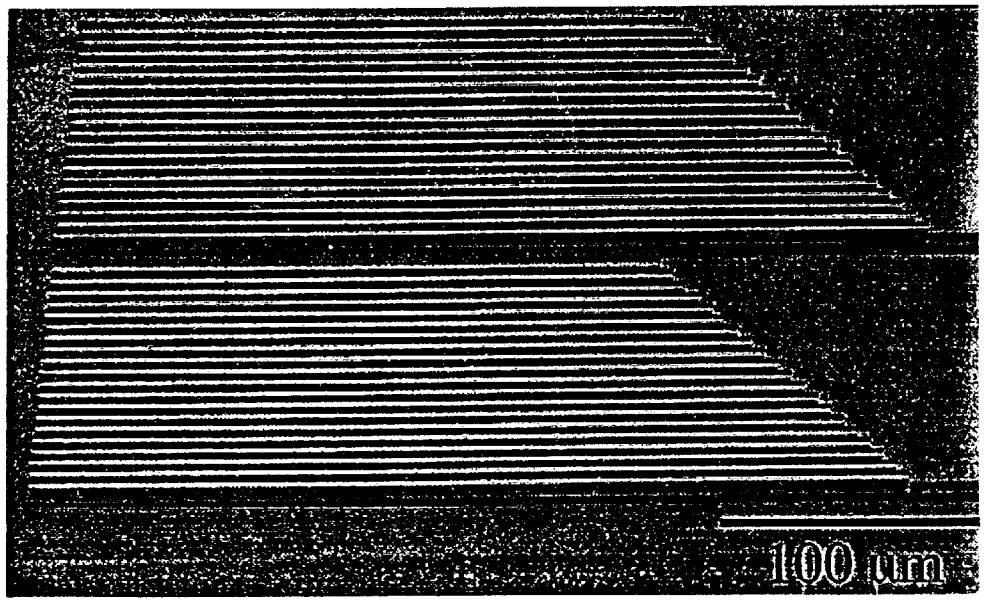
FIG. 14 is a micrograph of surface micromachined cantilever beams fabricated from a preferred embodiment ten layer polysilicon film in accordance with the present invention.

As seen in FIG. 12, the overall residual stress of the MultiPoly™ film is near zero as-deposited. The low stress is relatively unaffected by further annealing, which is important if subsequent higher temperature processing steps are required for device fabrication. The slight increase in residual stress upon annealing at 800° C. most likely results from slightly more rapid reduction of the stresses in compressive layers, compared to the stress reduction occurring in the tensile layers. While the overall stress was low, the 310 μm long cantilever beams fabricated from this film curved upwards with a maximum deflection of 2.0 μm at their ends, indicating a stress gradient of 6.7 MPa/μm. An SEM image is shown in FIGS. 13 and 14. The multi-layer film has equal amounts of compressive and tensile material distributed symmetrically about the midpoint of its thickness. Therefore, if the individual layers had uniform stresses, the multi-layer film would also display a zero stress gradient. However, this is not the case, and the individual layers must contain appreciable stress gradients. In fact, that these layers contain gradients means that great care must be taken in designing the layer thicknesses and their distributions. One of the significant advantages of the present invention is that films of any desired stress and stress gradient can be readily designed.

Figure 15:
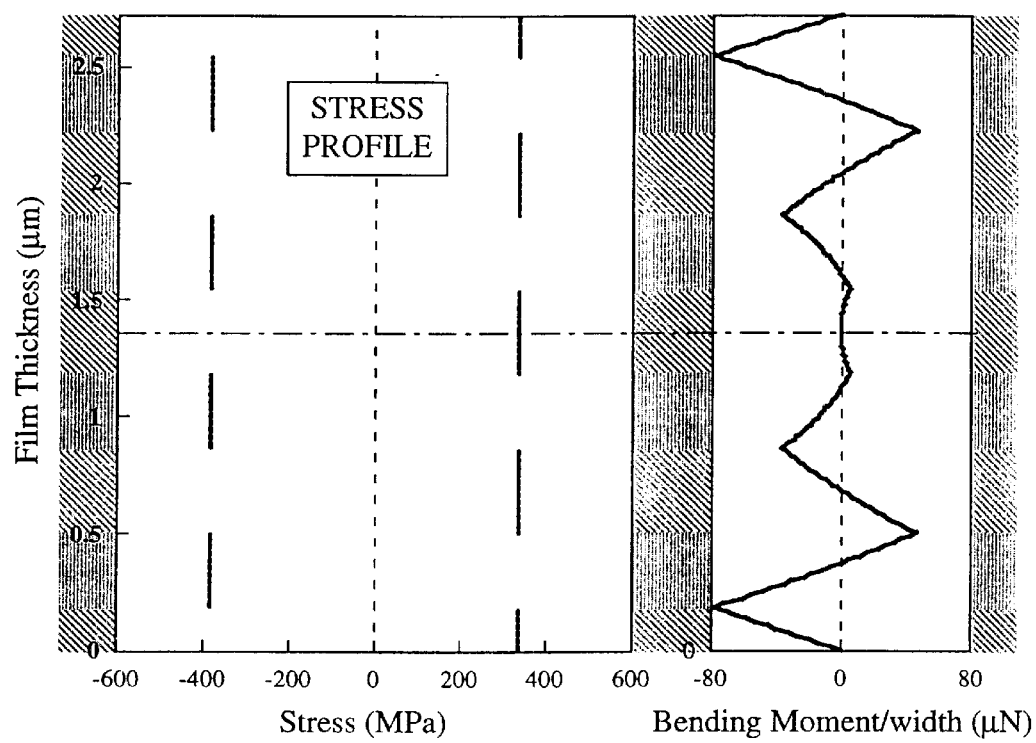
FIG. 15 are graphs illustrating the residual stresses and bending moments due to stresses within individual layers of the polysilicon film shown in FIG. 3, assuming uniform stresses in each of the nine layers.
Figure 16:
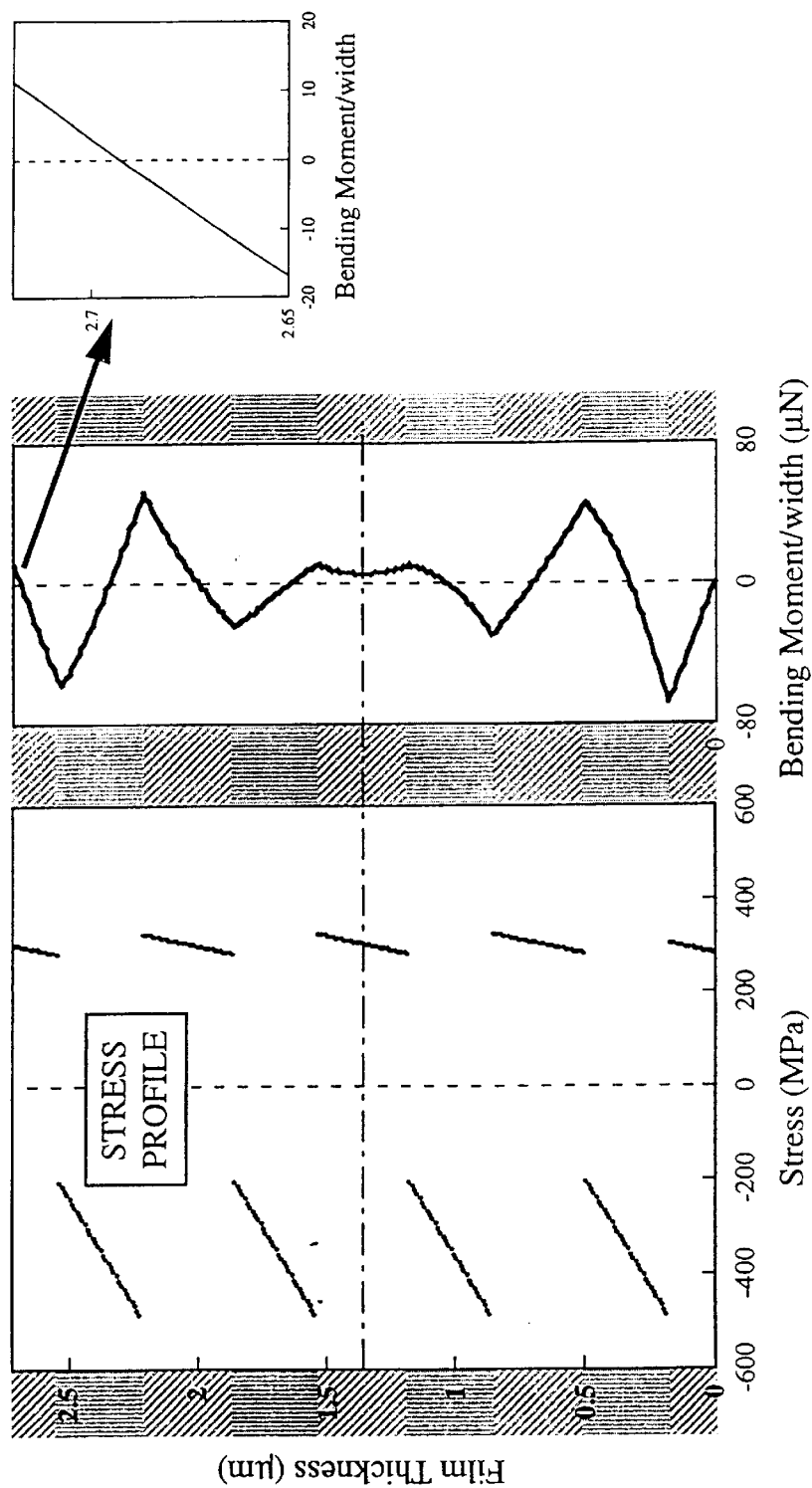
FIG. 16 are graphs illustrating the residual stresses and bending moments due to stresses within individual layers of the polysilicon film shown in FIG. 3, assuming linearly increasing stresses in each of the tensile layers and linearly decreasing stresses in each of the compressive layers.

These aspects are further illustrated in FIGS. 15 and 16. FIG. 15 shows the stress profile of a hypothetical 2.72 μm thick MultiPoly™ film taken through the film thickness, as if viewing the film in cross-section. Assuming the individual layers contained uniform stresses, the tensile stresses in the odd layers would exactly balance the compressive stresses in the even layers. When the cantilever beams are released, the stresses of the individual layers exert a bending moment on the beam, since the behavior of the tensile layers is to contract while that of the compressive layers is to expand. The bending moment put forth by each layer is equal to the force exerted by that layer due to its residual stress, multiplied by the distance between that layer and the midpoint of the film thickness (the axis around which the cantilever beam bends.) The force exerted by any individual layer due to its residual stress is equal to the stress times the layer thickness times the cantilever beam width. The cumulative bending moments associated with the residual stresses are plotted on the right hand side of FIG. 15, for a cantilever beam of unit width. As can be seen, the outer layers contribute more to the overall bending moment than the layers near the center. It can also be seen that the cumulative bending moments begin at zero at the bottom of the film, pass through zero at the midpoint of the film (due to the symmetry of the stresses), and end at zero at the top of the film. This film has no stress gradient, and the cantilever beam will display no curvature.

If, however, the individual tensile and compressive layers contain stress gradients, a stress profile such as that shown in FIG. 16 will result. A linearly increasing tensile stress is assumed in the layers deposited at 570° C., and a linearly decreasing compressive stress is assumed in the layers deposited at 615° C., which approximates the stress distribution in a typical multi-layer assembly, as will be discussed below. As was the case for the MultiPoly™ film shown in FIG. 15, the sum of the stresses plotted in FIG. 16 are equal to zero, and the MultiPoly™ film can again be said to display zero residual stress. However, while the corresponding cumulative bending moments plotted in FIG. 16 are qualitatively similar to those in FIG. 15, they are not identical. The cumulative bending moments begin at zero at the bottom of the film, but do not end at zero at the top of the film. The bending moment at the top is 11 μN. The top part of the bending moment profile is shown in greater detail. This relatively small offset in bending moment is equivalent to a constant stress gradient of 6.7 MPa/μm. This cantilever beam will bend. The end of a 310 μm long beam will deflect upwards by 2 μm.

An advantage of the MultiPoly™ process is that the stresses and stress gradients can be brought into desired specifications by depositing additional polysilicon layers. Accordingly, if a low stress gradient is the primary requirement, a thin (17.5 nm thick) polysilicon layer could be deposited at 615° C. onto the MultiPoly™ film shown in FIG. 16. The resulting stress gradient would be approximately zero, while the overall film stress would become 2.6 MPa compressive. The stress and bending moment profiles of this film are plotted in FIG. 17. The last layer is shown as a dark thick line for clarity, and the top part of the bending moment profile is shown in greater detail.

Figure 18:
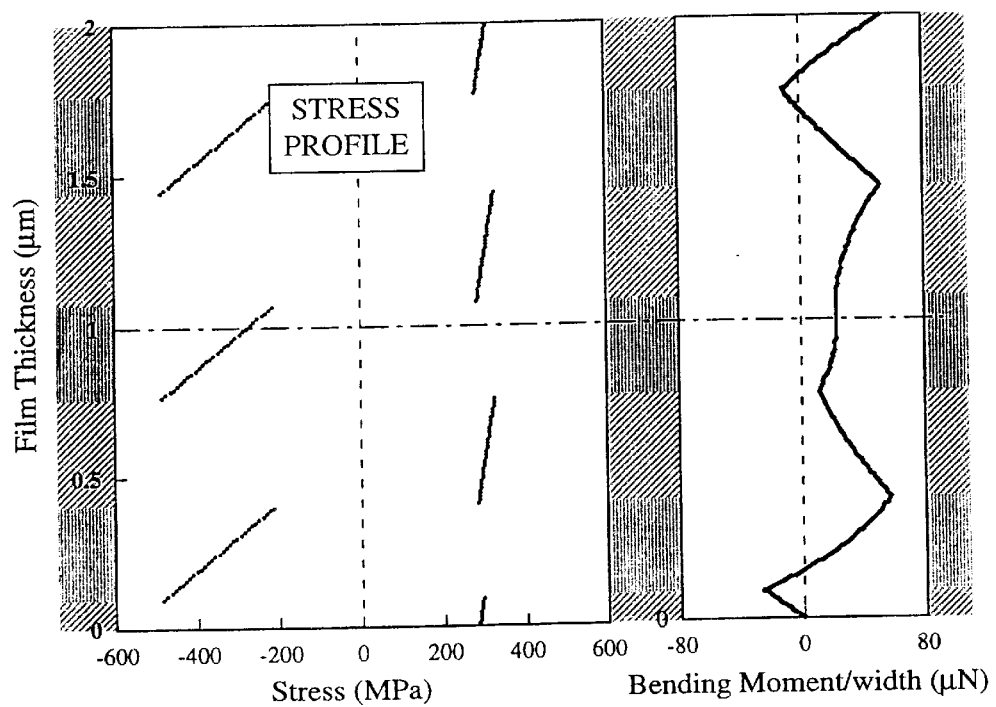
FIG. 18 are graphs illustrating the residual stresses and bending moments due to stresses within individual layers of a 2 μm thick preferred embodiment polysilicon film which will display a zero overall residual stress and a radius of curvature of 2 mm upon release.

On the other hand, if, for example, a 2 μm thick zero residual stress polysilicon film were desired such that specific structures would display a 2 mm radius of curvature upon release, the MultiPoly™ film shown in FIG. 18 should be suitable. The 7 layer thickness (from bottom to top) are 0.09, 0.31, 0.36, 0.31, 0.37, 0.32, and 0.24 μm. The overall residual stress is predicted to be less than 1 MPa, the cumulative bending moment is 53 μN, and the overall stress gradient 80 MPa/μm, which will result in the desired radius of curvature upon release. Semi-spherical mirrors based on such a recipe, which can be "flattened" by electrostatic actuation and used as fiber optic switches, may readily be fabricated in doped polysilicon.

The actual stress gradients within films deposited at 570° C. and 615° C. were determined using relatively thick films as shown in FIGS. 19 and 20. The data represented by open symbols were taken from as-deposited films of different thicknesses, and the data represented by solid symbols were taken from films which were etched back to reduce their thicknesses. For the layer thicknesses preferably employed in the Multipoly™ process ($\leq 0.5$ μm), both tensile and compressive films display negative stress gradients, i.e., the top part of the layer will be either more tensile or less compressive. Therefore, it is expected that multi-layers will also exhibit stress gradients, unless care is taken with the layer design.

Using the stress profiles shown in FIGS. 19 and 20 for guidance, a near-zero stress nine layer MultiPoly™ film was designed. The ratio of the total tensile layer thickness to compressive layer thickness was similar to the multi-layer film shown in FIG. 6, so that the overall residual stress would remain near zero, but the distribution of the tensile and compressive material through the thickness of the film was adjusted to achieve a near-zero residual stress gradient. The layer thicknesses were (from substrate to free surface) 0.49, 0.66, 0.56, 0.34, 0.71, 0.50, 0.41, 0.46, and 0.46 μm, where the five odd layers were deposited at 570° C. and the four even layers were deposited at 615° C. Following deposition, the film was annealed at 615° C. for two hours to fully crystallize the last fine-grained layer. The residual stress of this MultiPoly™ film was −13 MPa, and the 310 μm long cantilever beams fabricated from this film displayed a downward end deflection of 0.8 μm (as seen in FIG. 13), corresponding to a stress gradient of 2.6 MPa/μm.

Figure 17:
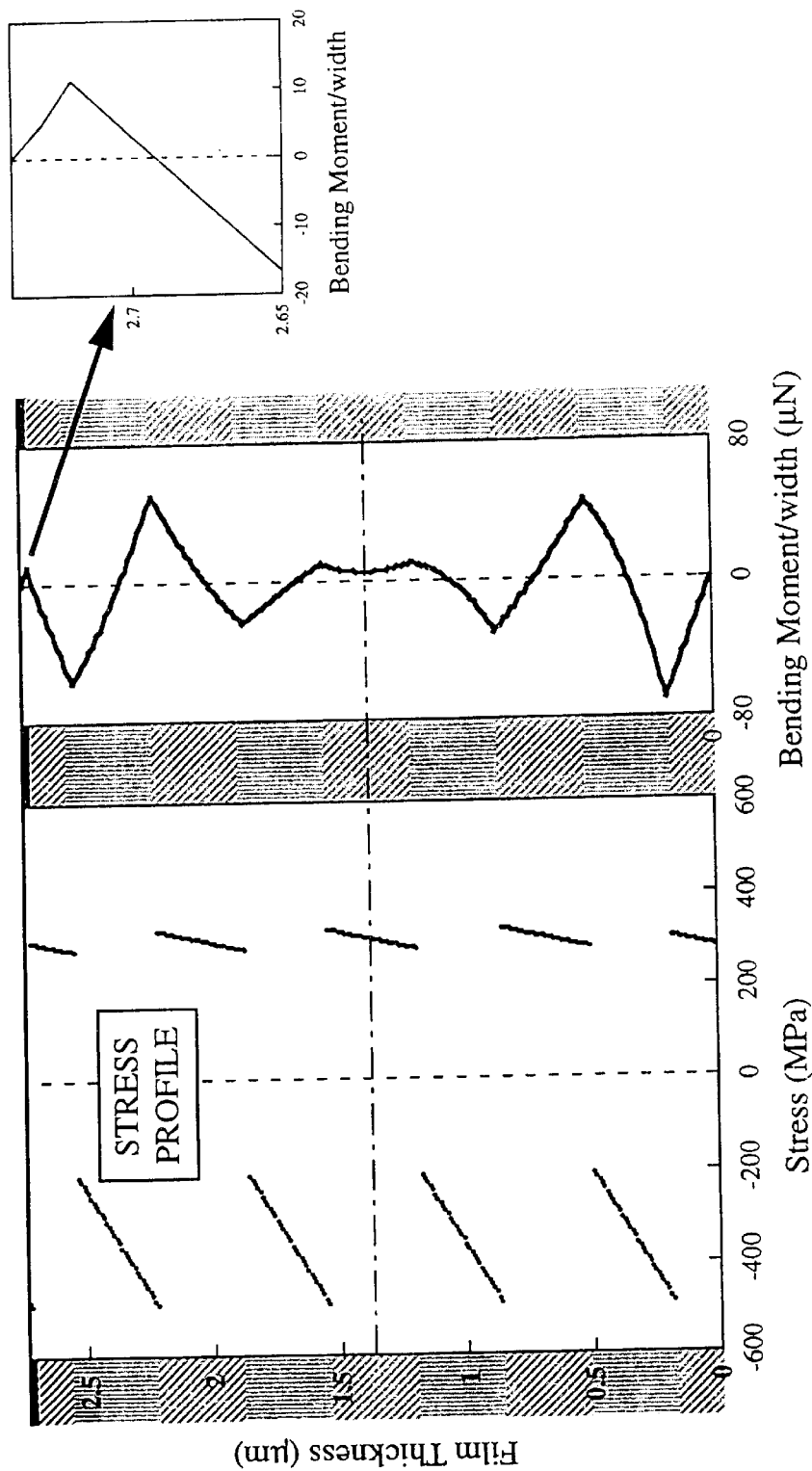
FIG. 17 are graphs illustrating the residual stresses and bending moments due to stresses within individual layers of the polysilicon film depicted in FIG. 16, with an additional 17.5 nm film of polysilicon deposited at 61 5oC.

These results indicate that the stress profiles in FIGS. 19 and 20 were not Known with sufficient accuracy to successfully design a zero-stress, zero-stress gradient film. However, the stresses and stress gradients within Multi-Poly™ films can be "fine tuned" to the desired specifications by depositing an additional thin polysilicon layer (as shown in FIGS. 16 and 17). Accordingly, a thin (0.10 μm thick) polysilicon layer was deposited at 570° C. onto a second MultiPoly™ film which had been fabricated along with the wafer described in the preceding paragraph. (The two hour crystallization anneal at 615° C. was repeated.) The resulting ten layer MultiPoly™ film had a residual stress of −8MPa, and the 310 μm long cantilever beams fabricated from this film displayed upward end deflections of approximately 0.1 μm (as seen in FIG. 14), which deflection is equal to one part in 3100 and corresponds to a stress gradient of $\leq 0.2$ MPa/μm, the lowest gradient that the present inventors were able to measure. This gradient is less than any that the inventors have been able to achieve in conventionally prepared 570° C. or 615° C. films subjected to 1100° C. annealing.

Figure 21:
FIG. 21 is a micrograph of surface micromachined devices fabricated from a single polysilicon film deposited at 570° C.
Figure 22:
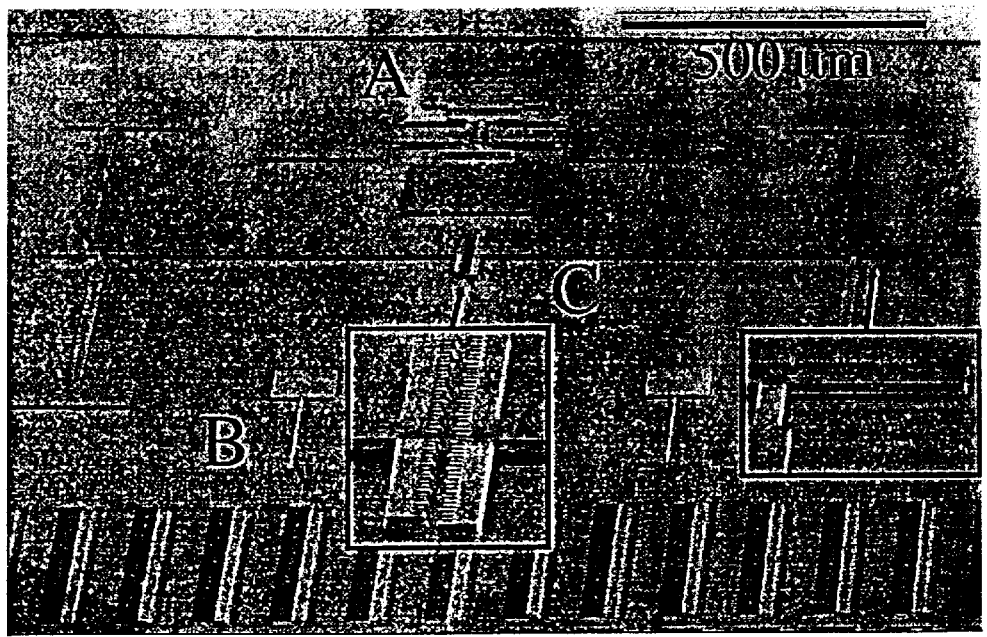
FIG. 22 is a micrograph of surface micromachined devices fabricated from a preferred embodiment ten layer polysilicon film in accordance with the present invention.

As a result of the near-zero stress and near-zero stress gradient characteristics associated with the preferred embodiment multi-layer films, large surface area micromachined devices can be fabricated that display no deformation following release. As an example, FIGS. 21 and 22 show a lateral resonator (A), a portion of an interdigitated comb-drive microactuator (B) for fracture mechanics testing, and the 1 MPa strain gauge (C) mentioned earlier. The devices in FIG. 21 were fabricated using a single 4 μm thick polysilicon film deposited at 570° C. and annealed for 30 minutes at 615° C. The displacement of the strain gauge corresponds to an average tensile stress of 236 MPa. The stress and the stress gradient in the film caused the bowing of the microactuator B. The same devices from the −8 MPa ten layer MultiPoly™ film described herein are shown in FIG. 22. The two ends of the strain gauge are shown in the insets. Although the total length of the central beam is 700 μm long and the thickness is 4.69 μm, there is no measurable curvature.

The preferred embodiment multi-layer polysilicon assembly may be used in a wide array of applications. Generally, any application that utilizes polysilicon as a mechanical material could benefit from the present invention. For examples, devices such as accelerometers, pressure sensors, and gyroscopes could utilize the present invention polysilicon multi-layer assemblies. For instance, improved accelerometers could be produced since accuracy of such devices stems from their signal to noise ratio, which ratio could be improved by constructing larger sensor structures. Additional applications and uses are contemplated for the present invention such as optical uses and RF wireless communication uses. Generally, the present invention provides improved stability, more predictable behavior and enables more precise design and engineering.

The MultiPoly™ process has been developed for producing polysilicon films with near-zero stress, near-zero stress gradients, and very low surface roughness, with a maximum process temperature of 615° C. Despite he relatively low deposition temperatures, the total stresses are essentially unaffected by high temperature annealing. The process involves deposition of alternate tensile fine-grained (devitrified) and compressive columnar layers of polysilicon, which are formed at growth temperatures of 570° C. and 615° C., respectively. The present inventors have demonstrated the fabrication of a 10 layer low-stress, low-gradient MultiPoly™ film. The inventors have also demonstrated that this technique can be used to design multi-layer polysilicon films with finite stress (from highly tensile to highly compressive) and finite stress gradients (from highly positive to highly negative) by adjusting the relative thickness and distribution of the tensile and compressive layers.

Yet another significant advantage provided by the present invention relates to the ability to selectively achieve or impart a desired bending moment to a multi-layer of polysilicon films by depositing a relatively thin outermost layer. By selecting the deposition temperature and thickness of that outer layer, the extent and type of stress within that outer layer may be selected. And, due to the relative position of that outer layer from the bending axis of the multi-layer, the overall bending moment of the multi-layer can readily be changed.

The present invention further provides an attractive technique for readily and inexpensively tailoring the stress characteristics of a plurality of multi-layer assemblies, particularly in an industrial environment. Specifically, in preparing a batch of a large quantity of multi-layer assemblies of polysilicon thin films, one or a few multi-layer assembly samples are designated as representative of the batch or quantity. The test sample(s) are analyzed and the stress profile and characteristics are identified. Having such information will then enable one to readily and inexpensively alter or change the stress characteristics of each multi-layer assembly by depositing one or more thin films as described herein with desired thickness and morphology such that the resulting thin layer will exhibit a certain stress that will alter the stress characteristics of the overall multi-layer assembly in a desired fashion. These practices are described in detail in conjunction with FIGS. 16 and 17.

It will also be understood that although the preferred embodiments of the present invention described herein are directed to undoped silicon, the present invention includes multi-layer assemblies and thin layers of doped polysilicon. Those skilled in the pertinent fields of art will appreciate that doping is often employed to alter the characteristics such as the electrical conductivity of the multi-layered assembly.

The present invention has been described with reference to the preferred embodiments and noted applications. Obviously, modifications and alterations will occur to others upon a reading and understanding of the preceding detailed description. It is intended that the invention be construed as including all such alterations and modifications in so far as they are within the scope of the claims or the equivalents thereof. For example, it is contemplated by the present inventors that the techniques and strategies associated with the invention may be utilized when depositing nearly any type of material, and particularly in forming multi-layer stacked assemblies of thin films.

Having thus described the invention, we claim:

1. A multi-layer thin film assembly comprising:
   a first thin film comprising polysilicon, said first thin film having a devitrified microstructure and an internal tensile stress;
   a second thin film comprising polysilicon, said second thin film having a predominantly columnar microstructure and an internal compressive stress, said first thin film being immediately adjacent said second thin film thereby avoiding the use of an intermediate layer between said first thin film and said second thin film;
   a substrate upon which is disposed one of said first thin film and said second thin film; and
   a third thin film disposed on the other one of said first thin film and said second thin film, said third thin film comprising polysilicon and having a thickness of from about 1 nm to about 1000 nm.

2. The multi-layer assembly of claim 1 wherein said first thin film is deposited at a temperature of from about 550° C. to about 590° C.

3. The multi-layer assembly of claim 2 wherein said first thin film is deposited at a temperature of about 570° C.

4. The multi-layer assembly of claim 1 wherein said second thin film is deposited at a temperature of from about 600° C. to about 700° C.

5. The multi-layer assembly of claim 4 wherein said second thin film is deposited at a temperature of from about 605° C. to about 650° C.

6. The multi-layer assembly of claim 5 wherein said second thin film is deposited at a temperature of about 615° C.

7. The multi-layer assembly of claim 1 wherein the RMS surface finish of said third thin film is less than about 25 nm.

8. The multi-layer assembly of claim 1 wherein the thickness of said first thin film ranges from about 100 nm to about 1000 nm.

9. The multi-layer assembly of claim 8 wherein the thickness of said second thin film ranges from about 100 nm to about 1000 nm.

10. The multi-layer assembly of claim 1 wherein the thickness of said multi-layer assembly is from about 1 micron to about 10 microns.

11. The multi-layer assembly of claim 1 wherein said first thin film is disposed on and immediately adjacent to said substrate.

12. The multi-layer assembly of claim 1 wherein said second thin film is disposed on and immediately adjacent to said substrate.

* * * * *